(12) United States Patent
Sasagawa et al.

(10) Patent No.: US 8,901,554 B2
(45) Date of Patent: Dec. 2, 2014

(54) SEMICONDUCTOR DEVICE INCLUDING CHANNEL FORMATION REGION INCLUDING OXIDE SEMICONDUCTOR

(75) Inventors: Shinya Sasagawa, Chigasaki (JP); Hiroshi Fujiki, Atsugi (JP); Yoshinori Ieda, Fuchu (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/484,742

(22) Filed: May 31, 2012

(65) Prior Publication Data

US 2012/0319101 A1     Dec. 20, 2012

(30) Foreign Application Priority Data

Jun. 17, 2011    (JP) ................. 2011-135024

(51) Int. Cl.
| | | |
|---|---|---|
| *H01L 29/10* | (2006.01) | |
| *H01L 29/786* | (2006.01) | |
| *H01L 29/417* | (2006.01) | |
| *H01L 29/66* | (2006.01) | |
| *H01L 21/02* | (2006.01) | |

(52) U.S. Cl.
CPC ....... *H01L 29/7869* (2013.01); *H01L 21/02554* (2013.01); *H01L 29/41733* (2013.01); *H01L 29/66742* (2013.01); *H01L 21/02565* (2013.01)
USPC ...... 257/43; 257/774; 257/775; 257/E29.296; 438/104

(58) Field of Classification Search
CPC ................. H01L 21/76804; H01L 21/02565; H01L 29/7869; H01L 29/1225
USPC .................................. 257/43, 774
See application file for complete search history.

(56) References Cited

U.S. PATENT DOCUMENTS

| 5,528,032 A | 6/1996 | Uchiyama |
|---|---|---|
| 5,731,856 A | 3/1998 | Kim et al. |

(Continued)

FOREIGN PATENT DOCUMENTS

| EP | 1737044 A | 12/2006 |
|---|---|---|
| EP | 2226847 A | 9/2010 |

(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters) , Sep. 27, 2004, vol. 85, No. 13, pp. 2541-2543.

(Continued)

*Primary Examiner* — Allen Parker
*Assistant Examiner* — Gardener W Swan
(74) *Attorney, Agent, or Firm* — Eric J. Robinson; Robinson Intellectual Property Law Office, P.C.

(57) ABSTRACT

A first insulating film in contact with an oxide semiconductor film and a second insulating film are stacked in this order over an electrode film of a transistor including the oxide semiconductor film, an etching mask is formed over the second insulating film, an opening portion exposing the electrode film is formed by etching a portion of the first insulating film and a portion of the second insulating film, the opening portion exposing the electrode film is exposed to argon plasma, the etching mask is removed, and a conductive film is formed in the opening portion exposing the electrode film. The first insulating film is an insulating film whose oxygen is partly released by heating. The second insulating film is less easily etched than the first insulating film and has a lower gas-permeability than the first insulating film.

13 Claims, 11 Drawing Sheets

(56) References Cited

U.S. PATENT DOCUMENTS

| | | | |
|---|---|---|---|
| 5,744,864 A | 4/1998 | Cillessen et al. | |
| 6,294,274 B1 | 9/2001 | Kawazoe et al. | |
| 6,294,799 B1 | 9/2001 | Yamazaki et al. | |
| 6,300,683 B1* | 10/2001 | Nagasaka et al. | 257/774 |
| 6,475,836 B1 | 11/2002 | Suzawa et al. | |
| 6,563,174 B2 | 5/2003 | Kawasaki et al. | |
| 6,657,692 B2 | 12/2003 | Shiota | |
| 6,686,228 B2 | 2/2004 | Suzawa et al. | |
| 6,727,522 B1 | 4/2004 | Kawasaki et al. | |
| 6,740,599 B2 | 5/2004 | Yamazaki et al. | |
| 6,900,462 B2 | 5/2005 | Suzawa et al. | |
| 6,939,731 B2* | 9/2005 | Ishizaki | 438/22 |
| 6,962,879 B2* | 11/2005 | Zhu et al. | 438/724 |
| 6,972,263 B2 | 12/2005 | Yamazaki et al. | |
| 7,049,190 B2 | 5/2006 | Takeda et al. | |
| 7,057,694 B2 | 6/2006 | Shiota | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,397,130 B2* | 7/2008 | Lee | 257/774 |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,633,085 B2 | 12/2009 | Suzawa et al. | |
| 7,642,573 B2 | 1/2010 | Hoffman et al. | |
| 7,674,650 B2 | 3/2010 | Akimoto et al. | |
| 7,727,898 B2 | 6/2010 | Yamazaki et al. | |
| 7,732,819 B2 | 6/2010 | Akimoto et al. | |
| 7,791,072 B2 | 9/2010 | Kumomi et al. | |
| 7,838,348 B2 | 11/2010 | Hoffman et al. | |
| 6,900,462 C1 | 7/2011 | Suzawa et al. | |
| 7,973,867 B2 | 7/2011 | Shiota | |
| 8,093,136 B2 | 1/2012 | Endo et al. | |
| 8,093,591 B2 | 1/2012 | Suzawa et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0127552 A1* | 5/2009 | Li et al. | 257/43 |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2009/0321731 A1 | 12/2009 | Jeong et al. | |
| 2010/0051938 A1 | 3/2010 | Hayashi et al. | |
| 2010/0065844 A1 | 3/2010 | Tokunaga | |
| 2010/0090217 A1 | 4/2010 | Akimoto | |
| 2010/0092800 A1 | 4/2010 | Itagaki et al. | |
| 2010/0109002 A1 | 5/2010 | Itagaki et al. | |
| 2010/0117075 A1 | 5/2010 | Akimoto et al. | |
| 2010/0200999 A1 | 8/2010 | Yamazaki et al. | |
| 2010/0224871 A1* | 9/2010 | Yamaguchi et al. | 257/43 |
| 2010/0295041 A1 | 11/2010 | Kumomi et al. | |
| 2011/0212569 A1 | 9/2011 | Yamazaki et al. | |
| 2011/0240998 A1* | 10/2011 | Morosawa et al. | 257/57 |
| 2011/0297930 A1* | 12/2011 | Choi et al. | 257/43 |
| 2012/0001170 A1 | 1/2012 | Yamazaki | |
| 2012/0231580 A1 | 9/2012 | Yamazaki et al. | |
| 2012/0292623 A1* | 11/2012 | Shiraga et al. | 257/59 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-275697 A | 9/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2001-305576 A | 10/2001 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |

(56) References Cited

FOREIGN PATENT DOCUMENTS

| JP | 2007-096055 A | 4/2007 |
|---|---|---|
| JP | 2007-123861 A | 5/2007 |
| WO | WO-2004/114391 | 12/2004 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.
Ikeda.T et al., "Full-Functional System Liquid Crystal Display Using CG-Silicon Technology,", SID Digest '04 : SID International Symposium Digest of Technical Papers, 2004, vol. 35, pp. 860-863.
Nomura.K et al., "Room-Temperature Fabrication of Transparent Flexible Thin-Film Transistors Using Amorphous Oxide Semiconductors,", Nature, Nov. 25, 2004, vol. 432, pp. 488-492.
Park.J at al., "Improvements in the Device Characteristics of Amorphous Indium Gallium Zinc Oxide Thin-Film Transistors by Ar Plasma Treatment,", Appl. Phys. Lett. (Applied Physics Letters) , Jun. 26, 2007, vol. 90, No. 26, pp. 262106-1-262106-3.
Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.
Hayashi.R et al., "42.1: Invited Paper: Improved Amorphous In—Ga—Zn—O TFTS,", SID Digest '08 : SID International Symposium Digest of Technical Papers, May 20, 2008, vol. 39, pp. 621-624.
Prins.M et al., "A Ferroelectric Transparent Thin-Film Transistor,", Appl. Phys. Lett. (Applied Physics Letters) , Jun. 17, 1996, vol. 68, No. 25, pp. 3650-3652.
Nakamura.M et al., "The phase relations in the $In_2O_3$—$Ga_2ZnO_4$—ZnO system at 1350° C,", Journal of Solid State Chemistry, Aug. 1, 1991, vol. 93, No. 2, pp. 298-315.
Kimizuka.N et al., "Syntheses and Single-Crystal Data of Homologous Compounds, $In_2O_3(ZnO)_m$ (m = 3, 4, and 5), $InGaO_3$, and $Ga_2O_3(ZnO)_m$ (m = 7, 8, 9, and 16) in the $In_2O_3$—$ZnGa_2O_4$—ZnO System,", Journal of Solid State Chemistry, Apr. 1, 1995, vol. 116, No. 1, pp. 170-178.
Nomura.K et al., "Thin-Film Transistor Fabricated in Single-Crystalline Transparent Oxide Semiconductor,", Science, May 23, 2003, vol. 300, No. 5623, pp. 1269-1272.
Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.
Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.
Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.
Nomura.K et al., "Carrier transport in transparent oxide semiconductor with intrinsic structural randomness probed using single-crystalline $InGaO_3(ZnO)_5$ filmes,", Appl. Phys. Lett. (Applied Physics Letters) , Sep. 13, 2004, vol. 85, No. 11, pp. 1993-1995.
Li.C et al., "Modulated Structures of Homologous Compounds $InMO_3(ZnO)_m$ (M=In,Ga; m=Integer) Described by Four-Dimensional Superspace Group,", Journal of Solid State Chemistry, 1998, vol. 139, pp. 347-355.
Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT,", SID Digest '08 : SID International Symposium Digest of Technical Papers, May 20, 2008, vol. 39, pp. 633-636.
Lee.J et al., "World'S Largest (15-Inch) XGA AMLCD Panel Using IGZO Oxide TFT,", SID Digest '08 : SID International Sympoisum Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.
Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.
Tsuda.K et al., "Ultra Low Power Consumption Technologies for Mobile TFT-LCDs ,", IDW '02 : Proceedings of the 9th International Display Workshops, Dec. 4, 2002, pp. 295-298.
Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.
Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.
Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.
Park.J et al., "High performance amorphous oxide thin film transistors with self-aligned top-gate structure,", IEDM 09: Technical Digest of International Electron Devices Meeting, Dec. 7, 2009, pp. 191-194.
Kurokawa.Y et al., "UHF RFCPUS on Flexible and Glass Substrates for Secure RFID Systems,", Journal of Solid-State Circuits , 2008, vol. 43, No. 1, pp. 292-299.
Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transition:The "Blue Phase", ", Physics Letters, Sep. 10, 1973, vol. 45A, No. 2, pp. 115-116.
Cho.D et al., "21.2:Al and SN-Doped Zinc Indium Oxide Thin Film Transistors for AMOLED Back Plane,", SID Digest '09 : SID International Symposium Digest of Technical Papers, May 31, 2009, pp. 280-283.
Lee.M et al., "15.4:Excellent Performance of Indium—Oxide—Based Thin-Film Transistors by DC Sputtering,", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.
Sakata.J et al., "Development of 4.0-In. AMOLED Display With Driver Circuit Using Amorphous In—Ga—Zn—Oxide TFTS,", IDW '09 : Proceedings of the 16th International Display Workshops, 2009, pp. 689-692.
Park.J et al., "Amorphous Indium—Gallium—Zinc Oxide TFTS and Their Application for Large Size AMOLED,", AM-FPD '08 Digest of Technical Papers, Jul. 2, 2008, pp. 275-278.
Park.S et al., "Challenge to Future Displays: Transparent AM-OLED Driven by Peald Grown ZnO TFT,", IMID '07 Digest, 2007, pp. 1249-1252.
Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.
Osada.T et al., "Development of Driver-Integrated Panel Using Amorphous In—Ga—Zn—Oxide TFT,", AM-FPD '09 Digest of Technical Papers, Jul. 1, 2009, pp. 33-36.
Hirao.T et al., "Novel Top-Gate Zinc Oxide Thin-Film Transistors (ZnO TFTS) for AMLCDS,", Journal of the SID, 2007, vol. 15, No. 1, pp. 17-22.
Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In—Ga—Zn—Oxide TFT,", SID

(56) References Cited

OTHER PUBLICATIONS

Digest '09 : SID International Symposium Digest of Technical Papers, May 31, 2009, pp. 1110-1112.
Ohara.H et al., "21.3:4.0 in. QVGA AMOLED Display Using In—Ga—Zn—Oxide TFTS With a Novel Passivation Layer,", SID Digest '09 : SID International Symposium Digest of Technical Papers, May 31, 2009, pp. 284-287.
Miyasaka.M, "Suftla Flexible Microelectronics on Their Way to Business,", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors,", IEEE Transactions of Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.
Asaoka.Y et al., "29.1: Polarizer-Free Reflective LCD Combined With Ultra Low-Power Driving Technology,", SID Digest '09 : SID International Symposium Digest of Technical Papers, May 31, 2009, pp. 395-398.
Lee.H et al., "Current Status of, Challenges to, and Perspective View of AM-OLED ,", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Cyrstalline Blue Phases for Display Application,", SID Digest '07 : SID International Symposium Digest of Technical Papers, 2007, vol. 38, pp. 1737-1740.
Nakamura.M, "Synthesis of Homologous Compound with New Long-Period Structure,", Nirim Newsletter, Mar. 1, 1995, vol. 150, pp. 1-4.
Kikuchi.H et al., "Polymer-Stabilized Liquid Crystal Blue Phases,", Nature Materials, Sep. 2, 2002, vol. 1, pp. 64-68.
Kimizuka.N et al., "Spinel,YBFE2O4, and YB2FE3O7 Types of Structures for Compounds in the In2O3 and SC2O3—A2O3—BO Systems [A; Fe, Ga, or Al; B: Mg, Mn, Fe, Ni, Cu, or Zn] at Temperatures Over 1000° C,", Journal of Solid State Chemistry, 1985, vol. 60, pp. 382-384.
Kitzerow.H et al., "Observation of Blue Phases in Chiral Networks,", Liquid Crystals, 1993, vol. 14, No. 3, pp. 911-916.
Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.
Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.
Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.
Orita.M et al., "Mechanism of Electrical Conductivity of Transparent InGaZnO4,", Phys. Rev. B (Physical Review. B), Jan. 15, 2000, vol. 61, No. 3, pp. 1811-1816.
Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.
Janotti.A et al., "Native Point Defects in ZnO,", Phys. Rev. B (Physical Review. B), Oct. 4, 2007, vol. 76, No. 16, pp. 165202-1-165202-22.
Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.
Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.
Janotti.A et al., "Oxygen Vacancies in ZnO,", Appl. Phys. Lett. (Applied Physics Letters) , 2005, vol. 87, pp. 122102-1-122102-3.
Oba.F et al., "Defect energetics in ZnO: A hybrid Hartree-Fock density functional study,", Phys. Rev. B (Physical Review. B), 2008, vol. 77, pp. 245202-1-245202-6.
Orita.M et al., "Amorphous transparent conductive oxide InGaO3(ZnO)m (m<4):a Zn4s conductor,", Philosophical Magazine, 2001, vol. 81, No. 5, pp. 501-515.
Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.
Mo.Y et al., "Amorphous Oxide TFT Backplanes for Large Size AMOLED Displays,", IDW '08 : Proceedings of the 6th International Display Workshops, Dec. 3, 2008, pp. 581-584.
Kim.S et al., "High-Performance oxide thin film transistors passivated by various gas plasmas,", 214th ECS Meeting, 2008, No. 2317, ECS.
Clark.S et al., "First Principles Methods Using Castep,", Zeitschrift fur Kristallographie, 2005, vol. 220, pp. 567-570.
Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.
Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.
Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.
Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

* cited by examiner

● In
☾ Sn
☾ Zn
• O

● In
◐ Ga
◐ Zn
• O

SEMICONDUCTOR DEVICE INCLUDING CHANNEL FORMATION REGION INCLUDING OXIDE SEMICONDUCTOR

BACKGROUND OF THE INVENTION

1. Field of the Invention

The present invention relates to a manufacturing method of a semiconductor device. A semiconductor device refers to a semiconductor element itself or a device including a semiconductor element. As an example of such a semiconductor element, for example, a transistor can be given. A semiconductor device also refers to a display device such as a liquid crystal display device.

2. Description of the Related Art

In recent years, semiconductor devices have been necessary for human life. Transistors included in such semiconductor devices are manufactured by forming a film over a substrate and processing the film into a desired shape by etching or the like.

In such a manufacturing method of a semiconductor device, for example, a first conductive film is formed, an insulating film is formed to cover the first conductive film, an opening portion overlapping with the first conductive film is formed in the insulating film, and a second conductive film which is connected to the first conductive film through the opening portion may be formed. In such a manner, a plurality of wirings provided using different conductive films is arranged vertically and horizontally; thus an element substrate on which a plurality of elements is arranged in a matrix can be manufactured.

Not only the cross-sectional shape of such an opening portion, but also the state of the surface of the opening portion depends on etching conditions. For example, etching residues exist in the opening portion in many cases. Such an etching residue existing in the opening portion may inhibit a connection of a plurality of conductive films in some cases. As a method for removing such a residue in the opening portion, reverse sputtering can be given (e.g., Patent Document 1).

On the other hand, in recent years, metal oxides having semiconductor characteristics (hereinafter, referred to as oxide semiconductors) have attracted attention. Oxide semiconductors can be applied to transistors (Patent Documents 2 and 3).

REFERENCE

[Patent Document 1] Japanese Published Patent Application No. 2001-305576
[Patent Document 2] Japanese Published Patent Application No. 2007-123861
[Patent Document 3] Japanese Published Patent Application No. 2007-096055

SUMMARY OF THE INVENTION

A transistor in which an oxide semiconductor film is used for a channel formation region has favorable electric characteristics such as extremely higher field-effect mobility than a semiconductor device in which a silicon film is used for a channel formation region. However, at present, such a semiconductor device has a problem in reliability. As one of factors of decrease in the reliability of a semiconductor device, water and hydrogen contained in an oxide semiconductor film can be given. Therefore, it is important to reduce the amount of water and hydrogen contained in an oxide semiconductor film as much as possible.

In addition, when many oxygen vacancies are contained in the oxide semiconductor film used in such a transistor, the resistance of a region where the oxygen vacancies exist is reduced, which causes leakage current between a source and a drain. Accordingly, oxygen vacancies in the oxide semiconductor film are preferably reduced. In order to reduce oxygen vacancies, enough oxygen is preferably supplied from the outside.

One of methods for reducing the amount of water and hydrogen in an oxide semiconductor film and supplying oxygen is, for example, heat treatment which is performed in a state where a base film is provided in contact with the oxide semiconductor film. By heat treatment in a state where the amount of water and hydrogen in the base film is reduced and the amount of oxygen contained in the base film is increased, oxygen can be supplied to the oxide semiconductor film while entry of water and hydrogen into the oxide semiconductor film is suppressed.

In order to reduce the amount of water and hydrogen in the base film, heat treatment may be performed after formation of the base film by a CVD method, a sputtering method, or the like before formation of the oxide semiconductor film. However, when heat treatment is performed, oxygen is also released together with water and hydrogen.

In order to prevent such release of oxygen, an aluminum oxide film may be provided as a barrier film in heat treatment. However, it takes a long time to etch the aluminum oxide film, because aluminum oxide has poor chemical reactivity. Therefore, in the case where an insulating film in which an opening portion is formed is a multi-layer film, and part of the layers is formed using aluminum oxide, it takes a long time to form the opening portion, so that many etching residues are generated in the opening portion. Such etching residues, in the case where the opening portion is a contact hole, may cause an increase in contact resistance.

In one embodiment of the present invention, it is an object to provide a semiconductor device having a high reliability, in which leakage current between a source and a drain does not easily flow, and in which a contact resistance is low and to provide a manufacturing method thereof.

Another embodiment of the present invention is a manufacturing method of a semiconductor device including the steps of forming a transistor in which a channel formation region is formed in an oxide semiconductor film, forming a first insulating film provided in contact with the oxide semiconductor film and a second insulating film in this order stacked over an electrode film of the transistor, forming an etching mask including an opening portion over the second insulating film, forming an opening portion exposing the electrode film by etching a portion of the first insulating film and a portion of the second insulating film, which overlap with the opening portion of the etching mask, exposing the opening portion of the first insulating film and the second insulating film to argon plasma, removing the etching mask, and forming a conductive film in the opening portion of the first insulating film and the second insulating film. The first insulating film is an insulating film in which part of oxygen is released by heating, and the second insulating film is less easily etched than the first insulating film and has a higher gas barrier property than the first insulating film.

Another embodiment of the present invention is a manufacturing method of a semiconductor device including the steps of forming a transistor in which a channel formation region is formed in an oxide semiconductor film, forming a first insulating film provided in contact with the oxide semiconductor film and a second insulating film in this order stacked over an electrode film of the transistor, forming an etching mask including an opening portion over the second insulating film, forming an opening portion exposing the electrode film by etching a portion of the first insulating film and the second insulating film, which overlap with the opening portion of the etching mask, removing the etching mask, subjecting the opening portion of the first insulating film and the second insulating film to reverse sputtering, and forming a conductive film in the opening portion of the first insulating film and the second insulating film by a sputtering method. The first insulating film is an insulating film in which part of oxygen is released by heating, and the second insulating film is less easily etched than the first insulating film and has a higher gas barrier property than the first insulating film.

In the above-described structures, the first insulating film is preferably a silicon oxide film, a silicon oxynitride film, or a silicon nitride oxide film, and the second insulating film is preferably an aluminum oxide film.

Another embodiment of the present invention is a manufacturing method of a semiconductor device including the steps of forming a transistor in which a channel formation region is formed in an oxide semiconductor film, forming a first insulating film provided in contact with the oxide semiconductor film, a second insulating film, and a third insulating film in this order stacked over an electrode film of the transistor, forming an etching mask including an opening portion over the third insulating film, forming an opening portion exposing the electrode film by etching a portion of the first insulating film, a portion of the second insulating film, and a portion of the third insulating film, which overlap with the opening portion of the etching mask, exposing the opening portion of the first insulating film, the second insulating film, and the third insulating film to argon plasma, removing the etching mask, and forming a conductive film in the opening portion of the first insulating film, the second insulating film, and the third insulating film. The first insulating film is an insulating film in which part of oxygen is released by heating, and the second insulating film is less easily etched than the first insulating film and has a higher gas barrier property than the first insulating film.

Another embodiment of the present invention is a manufacturing method of a semiconductor device including the steps of forming a transistor in which a channel formation region is formed in an oxide semiconductor film, forming a first insulating film provided in contact with the oxide semiconductor film, a second insulating film, and a third insulating film in this order stacked over an electrode film of the transistor, forming an etching mask including an opening portion over the third insulating film, forming an opening portion exposing the electrode film by etching a portion of the first insulating film, the second insulating film, and the third insulating film, which overlap with the opening portion of the etching mask, removing the etching mask, subjecting the opening portion of the first insulating film, the second insulating film, and the third insulating film to a reverse sputtering, and forming a conductive film in the opening portion of the first insulating film, the second insulating film, and the third insulating film by a sputtering method. The first insulating film is an insulating film in which part of oxygen is released by heating, and the second insulating film is less easily etched than the first insulating film and has a higher gas barrier property than the first insulating film.

In the above-described structures, the first insulating film and the third insulating film are each preferably a silicon oxide film, a silicon oxynitride film, or a silicon nitride oxide film, and the second insulating film is preferably an aluminum oxide film.

In the above-described structures, the third insulating film is preferably thicker than the first insulating film.

In this specification, an "electrode film" refers to a conductive film to be a gate electrode, a source electrode, or a drain electrode collectively. That is, an "electrode film" refers to a conductive film to be a gate electrode, a source electrode, or a drain electrode, and the function is not limited.

In this specification, a "gas barrier property" refers to a property with respect to at least oxygen gas, and "high gas barrier property" means low oxygen gas-permeability, and "low gas barrier property" means high oxygen gas-permeability.

In this specification, an "etching mask" refers to a mask formed for preventing etching of a film formed below the etching mask. As an etching mask, a resist mask can be given, for example.

According to one embodiment of the present invention, a semiconductor device having a high reliability, in which leakage current between a source and a drain does not easily flow, and in which a contact resistance is low can be obtained.

DETAILED DESCRIPTION OF THE INVENTION

Hereinafter, embodiments of the present invention will be described in detail with reference to the accompanying drawings. However, the present invention is not limited to the following description and it is easily understood by those skilled in the art that the mode and details can be variously changed without departing from the scope and spirit of the present invention. Accordingly, the present invention should not be construed as being limited to the description of the embodiments below.

Embodiment 1

In this embodiment, a manufacturing method of a semiconductor device which is one embodiment of the present invention will be described. In this embodiment, a stacked-layer insulating film in which an opening portion is formed has a two-layer structure.

Figure 1A:
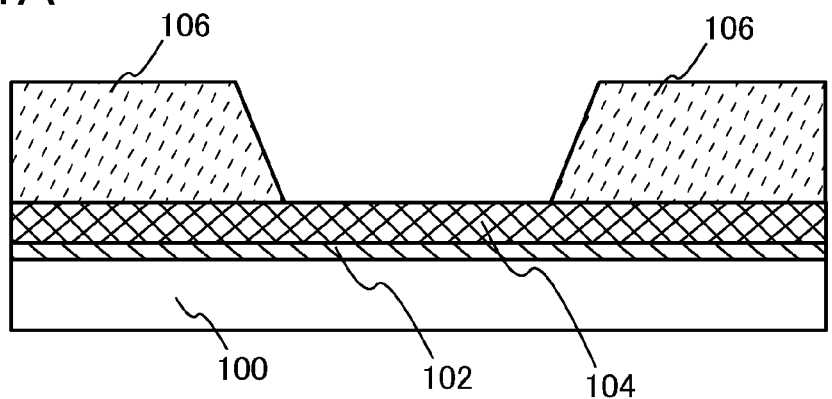
FIGS. 1A to 1C illustrate a method for manufacturing a semiconductor device according to one embodiment of the present invention.

First, a base insulating film 102 and a first conductive film 104 are formed over a substrate 100, and a first etching mask 106 is formed over the first conductive film 104 (FIG. 1A).

The substrate 100 is not limited to a certain type, and has enough heat resistance and chemical resistance in a process of manufacturing a semiconductor device. As the substrate 100, a glass substrate, a quartz substrate, a ceramic substrate, a plastic substrate, and the like can be given. For a plastic substrate, a plastic material having low refractive index anisotropy is preferably used. As the plastic material having low refractive index anisotropy, polyether sulfone, polyimide, polyethylene naphthalate, polyvinyl fluoride, polyester, polycarbonate, an acrylic resin, a prepreg, and the like can be given.

The base insulating film 102 may be formed using an insulating oxide which functions as an oxygen supply source. Therefore, the base insulating film 102 may be formed using an insulating oxide in which more oxygen than that in the stoichiometric proportion is contained and part of the oxygen is released by heat treatment. As an example of such an insulating oxide, silicon oxide represented by $SiO_x$ where $x>2$ can be given.

However, a material of the base insulating film 102 is not limited thereto, and the base insulating film 102 may be formed using silicon oxide, silicon oxynitride, silicon nitride oxide, aluminum oxide, aluminum oxynitride, gallium oxide, hafnium oxide, yttrium oxide, or the like.

Note that "silicon nitride oxide" contains more nitrogen than oxygen and "silicon oxynitride" contains more oxygen than nitrogen.

The base insulating film 102 may have a single-layer structure or a stacked-layer structure of a plurality of layers. For example, as the stacked-layer structure of a plurality of layers, a stacked structure in which a silicon oxide film is formed over a silicon nitride film is given.

The thickness of the base insulating film 102 is greater than or equal to 50 nm, preferably greater than or equal to 200 nm and less than or equal to 500 nm. In particular, when the thickness is increased within the above range, much oxygen can be diffused into the oxide semiconductor film by heat treatment and defects (oxygen vacancies) at the interface between the base insulating film 102 and the oxide semiconductor film can be reduced, which is preferable.

In an insulating oxide which contains more oxygen than the stoichiometric proportion, part of the oxygen is easily released by heat treatment. The release amount of oxygen (the value converted into that of oxygen atoms) obtained by TDS analysis when part of oxygen is easily released by heat treatment is greater than or equal to $1.0 \times 10^{18}$ atoms/cm$^3$, preferably greater than or equal to $1.0 \times 10^{20}$ atoms/cm$^3$, more preferably greater than or equal to $3.0 \times 10^{20}$ atoms/cm$^3$.

Here, the release amount of oxygen in the TDS analysis (the value converted into the number of oxygen atoms) is measured with a thermal desorption spectroscopy apparatus produced by ESCO Ltd., EMD-WA1000S/W, and calculated using a silicon wafer containing hydrogen atoms at $1 \times 10^{16}$ atoms/cm$^3$ as the standard sample.

Here, the TDS analysis is described. The release amount of a gas in the TDS analysis is proportional to a time integration value of ion intensity. Thus, the release amount of a gas can be calculated from the time integral value of the ion intensity of an insulating oxide and a reference value of a standard sample. The reference value of a standard sample refers to the ratio of the density of a predetermined atom contained in a sample (standard sample) to the integral value of a spectrum.

For example, by using the ion intensity of a silicon wafer containing a predetermined density of hydrogen, which is a standard sample, and the ion intensity of an insulating oxide, the release amount ($N_{O2}$) of oxygen molecules ($O_2$) of the insulating oxide can be obtained by the following formula (1).

(FORMULA 1)

$$N_{O2} = N_{H2}/S_{H2} \times S_{O2} \times \alpha \tag{1}$$

$N_{H2}$ is a value obtained by conversion of the number of hydrogen molecules ($H_2$) released from the standard sample into density. $S_{H2}$ is a value obtained by time integration of the ion intensity of hydrogen molecules ($H_2$) of the standard sample. In other words, the reference value of the standard sample is $N_{H2}/S_{H2}$. $S_{O2}$ is a value obtained by time integration of the ion intensity of oxygen molecules ($O_2$) of the insulating oxide. $\alpha$ is a coefficient affecting the ion intensity. Refer to Japanese Published Patent Application No. H6-275697 for details of Formula 1.

Note that in the TDS analysis, oxygen is partly detected as an oxygen atom. The ratio between oxygen molecules and oxygen atoms can be calculated from the ionization rate of the oxygen molecules. Note that, since the coefficient $\alpha$ includes the ionization rate of the oxygen molecules, the number of the released oxygen atoms can also be calculated through the evaluation of the number of the released oxygen molecules.

Note that $N_{O2}$ is the release amount of oxygen molecules ($O_2$); therefore, the release amount of oxygen converted into oxygen atoms is twice the release amount of oxygen molecules ($O_2$).

The base insulating film 102 may be formed by a sputtering method, a CVD method, or the like. In the case of using a CVD method, hydrogen or the like is preferably released and removed from the formed base insulating film 102 by heat treatment.

In the case where the base insulating film 102 is formed using a silicon oxide by a sputtering method, a quartz (preferably, synthesized quartz) target may be used as a target, and an argon gas may be used as a sputtering gas. Alternatively, a silicon target and a gas containing oxygen may be used as a target and a sputtering gas, respectively. As the gas containing oxygen, only an oxygen gas may be used or a mixed gas of an argon gas and an oxygen gas may be used.

The first conductive film 104 may be formed using a conductive material. Here, as a conductive material, a metal such as aluminum, chromium, copper, tantalum, titanium, molybdenum, tungsten, manganese, magnesium, beryllium, or zirconium or an alloy containing one or more of the above metals as a component can be given. The first conductive film 104 may have a single-layer structure or a stacked-layer structure.

Note that the first conductive film 104 is preferably formed using copper because the resistance of a wiring formed using the first conductive film 104 can be reduced. Here, in the case where the first conductive film 104 has a stacked structure, at least one layer of the first conductive film 104 is formed using copper.

Alternatively, the first conductive film 104 may be formed using a light-transmitting conductive material such as indium tin oxide, indium oxide containing tungsten oxide, indium zinc oxide containing tungsten oxide, indium oxide containing titanium oxide, indium tin oxide containing titanium oxide, or indium tin oxide to which indium zinc oxide or silicon oxide is added.

Alternatively, the first conductive film 104 may be formed by stacking a film of the light-transmitting conductive material and a film of the metal.

The thickness of the first conductive film 104 may be, for example, greater than or equal to 100 nm and less than or equal to 300 nm.

The first conductive film 104 may be formed by a sputtering method, a CVD method, or the like.

The first etching mask 106 may be formed of a resist material. Note that there is no limitation thereto as long as it functions as a mask when the first conductive film 104 is processed.

Here, after the base insulating film 102 is formed, heat treatment which removes hydrogen from the base insulating film 102 is preferably performed before the first conductive film 104 is formed. Alternatively, after the first conductive film 104 is formed, heat treatment which removes hydrogen from the base insulating film 102 may be performed before the first etching mask 106 is formed.

Figure 1B:
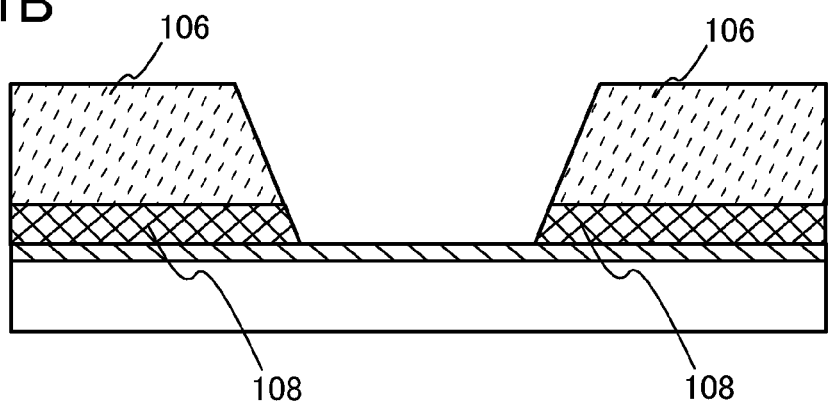

Next, the first conductive film 104 is processed with the use of the first etching mask 106, so that the first conductive film 108 is formed (FIG. 1B).

The first conductive film 104 may be processed by dry etching. For example, a chlorine gas or a mixed gas of a boron trichloride gas and a chlorine gas can be given as an etching gas used for the dry etching. However, there is no limitation thereto; wet etching may be used or another method may be used.

The first conductive film 108 functions at least as a source electrode and a drain electrode.

Figure 1C:
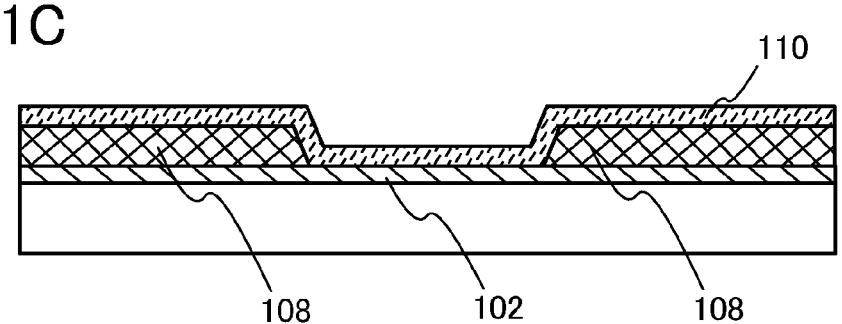

Next, the first etching mask 106 is removed, and an oxide semiconductor film 110 is formed over and in contact with the base insulating film 102 and the first conductive film 108 (FIG. 1C).

Here, after the first etching mask 106 is removed and before the oxide semiconductor film 110 is formed, heat treatment which removes hydrogen from the base insulating film 102 may be performed.

In the case where the first etching mask 106 is formed using a resist material, the first etching mask 106 may be removed by ashing using oxygen plasma. Alternatively, a resist stripper may be used. Further, alternatively, both of them may be used.

The oxide semiconductor film 110 preferably contains at least indium (In) or zinc (Zn). In particular, both In and Zn are preferably contained.

In addition, one or a plurality of elements selected from gallium (Ga), tin (Sn), hafnium (Hf), and aluminum (Al) is preferably contained as a stabilizer for reducing variations in electrical characteristics of the transistor including the oxide semiconductor film 110.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, an indium oxide, a tin oxide, a zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

Note that here, for example, an In—Ga—Zn-based oxide means an oxide containing In, Ga, and Zn, and there is no limitation on the composition ratio of In, Ga, and Zn. Further, the In—Ga—Zn-based oxide semiconductor may contain a metal element other than In, Ga, and Zn.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or an oxide with an atomic ratio close to the above atomic ratios can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or an oxide with an atomic ratio close to the above atomic ratios may be used.

However, without limitation to the materials given above, a material with an appropriate composition may be used depending on needed semiconductor characteristics (e.g., mobility, threshold voltage, and variation). In order to obtain necessary semiconductor characteristics, it is preferable that the carrier density, the impurity concentration, the defect density, the atomic ratio of a metal element to oxygen, the interatomic distance, the density, or the like of the oxide semiconductor film be set to be appropriate.

The oxide semiconductor film 110 may be either single crystal or non-single-crystal. In the case of non-single-crystal, the oxide semiconductor layer may be either amorphous or polycrystalline. Further, the oxide semiconductor may have a structure which includes crystalline portions in an amorphous portion, or the oxide semiconductor may be non-amorphous.

Here, one preferable mode of the oxide semiconductor film 110 will be described. One preferable mode of the oxide semiconductor film 110 is an oxide including a crystal with c-axis alignment (also referred to as c-axis aligned crystal (CAAC)), which has a triangular or hexagonal atomic arrangement when seen from the direction of an a-b plane, a surface, or an interface. In the crystal, metal atoms are arranged in a layered manner, or metal atoms and oxygen atoms are arranged in a layered manner along the c-axis, and the direction of the a-axis or the b-axis of one crystal is different from those of another crystal in the a-b plane (the crystal rotates around the c-axis). Hereinafter, such an oxide is simply referred to as CAAC.

The CAAC means a non-single-crystal oxide including a phase that has a triangular, hexagonal, regular triangular or regular hexagonal atomic arrangement when seen from the direction perpendicular to the a-b plane and in which metal atoms are arranged in a layered manner or metal atoms and oxygen atoms are arranged in a layered manner when seen from the direction perpendicular to the c-axis direction.

The CAAC is not a single crystal, but does not consist of only an amorphous state. Although the CAAC includes a crystallized portion (crystalline portion), a boundary between one crystalline portion and another crystalline portion is not clear in some cases.

In the case where oxygen is included in the CAAC, nitrogen may be substituted for part of oxygen included in the CAAC. The c-axes of individual crystalline portions included in the CAAC may be aligned in one direction (e.g., a direction perpendicular to a surface of a substrate over which the CAAC is formed or a surface of the CAAC). Alternatively, the normals of the a-b planes of the individual crystalline portions included in the CAAC may be aligned in one direction (e.g., a direction perpendicular to a surface of a substrate over which the CAAC is formed or a surface of the CAAC).

The CAAC may be a conductor, a semiconductor, or an insulator. Further, the CAAC may or may not transmit visible light.

As an example of such a CAAC, there is an oxide which is formed into a film shape and has a triangular or hexagonal atomic arrangement when observed from the direction perpendicular to a surface of the film or a surface of a formed substrate, and in which metal atoms are arranged in a layered manner or metal atoms and oxygen atoms (or nitrogen atoms) are arranged in a layered manner when a cross section of the film is observed.

The CAAC will be described in FIGS. 6A to 6E, FIGS. 7A to 7C, and FIGS. 8A to 8C. In FIGS. 6A to 6E, FIGS. 7A to 7C, and FIGS. 8A to 8C, the vertical direction basically corresponds to the c-axis direction and a plane perpendicular to the c-axis direction basically corresponds to the a-b plane. In the case where the expressions "an upper half" and "a lower half" are simply used, boundary is the a-b plane. Further, in FIGS. 6A to 6E, O surrounded by a circle represents tetracoordinate O and O surrounded by a double circle represents tricoordinate O.

Figure 6A:
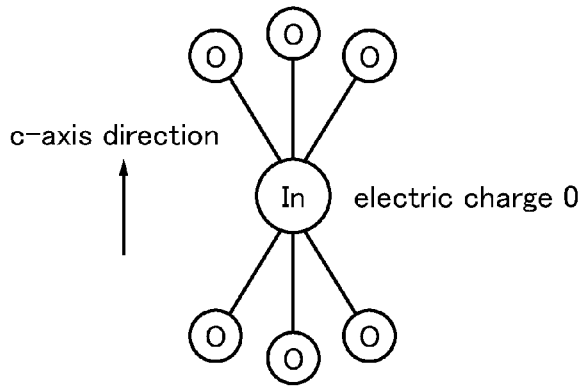
FIGS. 6A to 6E illustrate a structure of an oxide material which can be applied to one embodiment of the present invention.

FIG. 6A illustrates a structure including one hexacoordinate In atom and six tetracoordinate oxygen atoms (tetracoordinate O atoms) close to the In atom. A structure in which one metal atom and oxygen atoms close to the metal atom are only illustrated is called a small group here. The structure in FIG. 6A is actually an octahedral structure, but is illustrated as a planar structure for simplicity. Note that three tetracoordinate O atoms exist in each of an upper half and a lower half in FIG. 6A. In the small group illustrated in FIG. 6A, electric charge is 0.

Figure 6D:
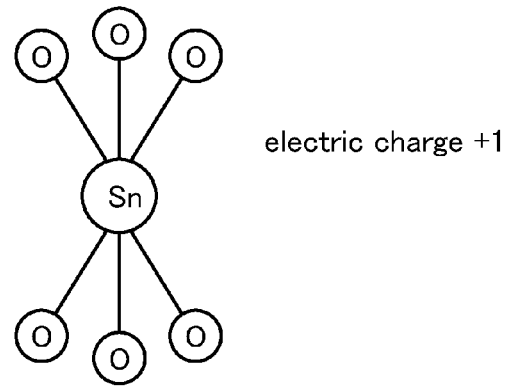
Figure 6B:
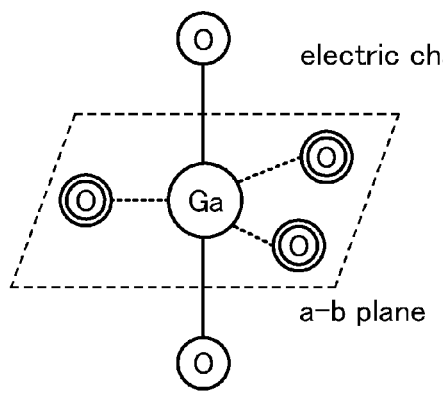

FIG. 6B illustrates a structure including one pentacoordinate Ga atom, three tricoordinate oxygen atoms (tricoordinate O atoms) close to the Ga atom, and two tetracoordinate O atoms close to the Ga atom. All the tricoordinate O atoms exist in the a-b plane. One tetracoordinate O atom exists in each of an upper half and a lower half in FIG. 6B. An In atom can have the structure illustrated in FIG. 6B because the In atom can have five ligands. In a small group illustrated in FIG. 6B, electric charge is 0.

Figure 6E:
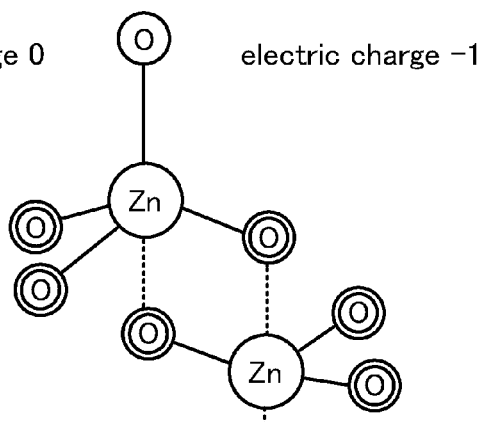
Figure 6C:
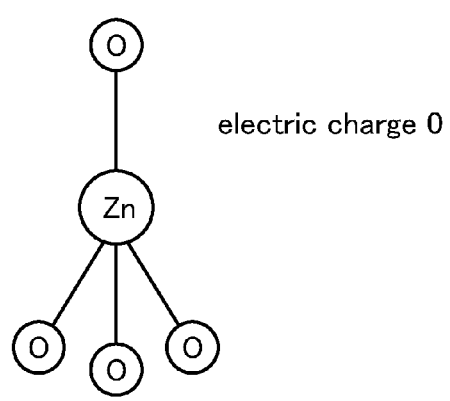

FIG. 6C illustrates a structure including one tetracoordinate Zn atom and four tetracoordinate O atoms close to the Zn atom. In FIG. 6C, one tetracoordinate O atom exists in an upper half and three tetracoordinate O atoms exists in a lower half. Alternatively, three tetracoordinate O atoms may exist in the upper half and one tetracoordinate O atom may exist in the lower half in FIG. 6C. In a small group illustrated in FIG. 6C, electric charge is 0.

FIG. 6D illustrates a structure including one hexacoordinate Sn atom and six tetracoordinate O atoms close to the Sn atom. In FIG. 6D, three tetracoordinate O atoms exists in each of an upper half and a lower half. In a small group illustrated in FIG. 6D, electric charge is +1.

FIG. 6E illustrates a small group including two Zn atoms. In FIG. 6E, one tetracoordinate O atom exists in each of an upper half and a lower half. In the small illustrated in FIG. 6E, electric charge is −1.

Here, a plurality of small groups form a medium group, and a plurality of medium groups form a large group (also referred to as a unit cell).

Here, a rule of bonding the small groups to each other is described. The three O atoms in the upper half with respect to the hexacoordinate In atom in FIG. 6A each have three proximity In atoms in the downward direction, and the three O atoms in the lower half each have three proximity In atoms in the upward direction. The one O atom in the upper half with respect to the pentacoordinate Ga atom in FIG. 6B has one proximity Ga atom in the downward direction, and the one O atom in the lower half has one proximity Ga atom in the upward direction. The one O atom in the upper half with respect to the tetracoordinate Zn atom in FIG. 6C has one proximity Zn atom in the downward direction, and the three O atoms in the lower half each have three proximity Zn atoms in the upward direction. In this manner, the number of the tetracoordinate O atoms above the metal atom is equal to the number of the proximity metal atoms below the tetracoordinate O atoms. Similarly, the number of the tetracoordinate O atoms below the metal atom is equal to the number of the proximity metal atoms above the tetracoordinate O atoms. Since the coordination number of the O atom is 4, the sum of the number of the proximity metal atoms below the O atom and the number of the proximity metal atoms above the O atom is 4. Accordingly, when the sum of the number of the tetracoordinate O atoms above the metal atom and the number of the tetracoordinate O atoms below another metal atom is 4, the two kinds of small groups including the metal atoms can be bonded to each other. For example, in the case where a hexacoordinate metal (In or Sn) atom is bonded through three tetracoordinate O atoms in the lower half, the hexacoordinate metal atom is bonded to a pentacoordinate metal (Ga or In) atom or a tetracoordinate metal (Zn) atom.

A metal atom having the above coordination number is bonded to another metal atom through a tetracoordinate O atom in the c-axis direction. Further, a plurality of small groups is bonded to each other so that the total electric charge in a layer structure is 0. Thus, a medium group is constituted.

Figure 7A:
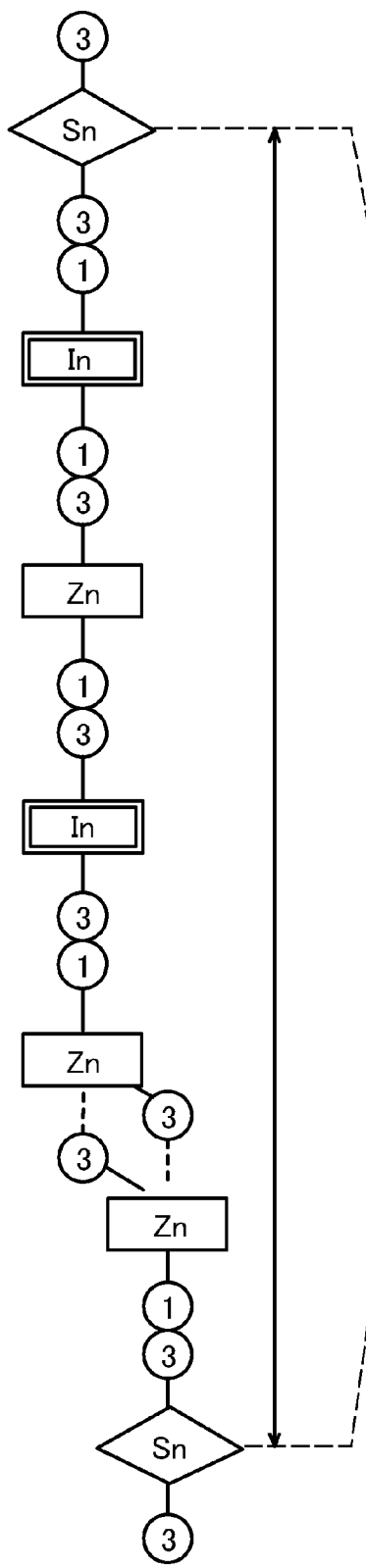
FIGS. 7A to 7C illustrate a structure of an oxide material which can be applied to one embodiment of the present invention.
Figure 7B:
Figure 7C:
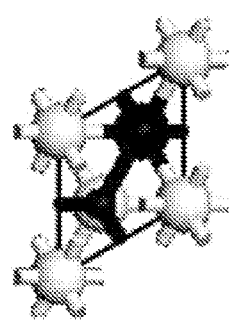

FIG. 7A illustrates a model of a medium group included in a layer structure of an In—Sn—Zn-based oxide. FIG. 7B illustrates a large group including three medium groups. Note that FIG. 7C illustrates atomic order in the case of the layer structure in FIG. 7B observed from the c-axis direction.

In FIG. 7A, for simplicity, a tricoordinate O atom is omitted and the number of tetracoordinate O atoms is illustrated. For example, three tetracoordinate O atoms existing in each of an upper half and a lower half with respect to a Sn atom are denoted by circled 3. Similarly, one tetracoordinate O atom existing in each of an upper half and a lower half with respect to an In atom is denoted by circled 1. Similarly, a Zn atom close to one tetracoordinate O atom in a lower half and three tetracoordinate O atoms in an upper half, and a Zn atom close to one tetracoordinate O atom in an upper half and three tetracoordinate O atoms in a lower half are denoted.

In the medium group included in the layer structure of the In—Sn—Zn-based oxide in FIG. 7A, in the order starting from the top, a Sn atom close to three tetracoordinate O atoms in each of an upper half and a lower half is bonded to an In atom close to one tetracoordinate O atom in each of an upper half and a lower half, the In atom is bonded to a Zn atom close to three tetracoordinate O atoms in an upper half, the Zn atom is bonded to an In atom close to three tetracoordinate O atoms in each of an upper half and a lower half through one tetracoordinate O atom in a lower half with respect to the Zn atom, the In atom is bonded to a small group that includes two Zn atoms and is close to one tetracoordinate O atom in an upper half, and the small group is bonded to a Sn atom close to three tetracoordinate O atoms in each of an upper half and a lower half through one tetracoordinate O atom in a lower half with respect to the small group. A plurality of such medium groups is bonded to each other so that a large group is constituted.

Here, electric charge for one bond of a tricoordinate O atom and electric charge for one bond of a tetracoordinate O atom can be assumed to be −0.667 and −0.5, respectively. For example, electric charge of a hexacoordinate or pentacoordinate In atom, electric charge of a tetracoordinate Zn atom, and electric charge of a pentacoordinate or hexacoordinate Sn atom are +3, +2, and +4, respectively. Thus, electric charge of a small group including a Sn atom is +1. Consequently, a structure having an electric charge of −1, which cancels an electric charge of +1, is needed to form a layer structure including a Sn atom. As a structure having an electric charge of −1, the small group including two Zn atoms as illustrated in FIG. 6E can be given. For example, when one small group including two Zn atoms is provided for one small group including a Sn atom, electric charge is canceled, so that the total electric charge in the layer structure can be 0.

Specifically, when a large group illustrated in FIG. 7B is repeated, a crystal of an In—Sn—Zn-based oxide ($In_2SnZn_3O_8$) can be obtained. Note that the layer structure of the obtained In—Sn—Zn-based oxide can be expressed as a composition formula, $In_2SnZn_2O_7(ZnO)_m$ (m is 0 or a natural number).

The above rule also applies to the following oxides: a quaternary metal oxide such as an In—Sn—Ga—Zn-based oxide; a ternary metal oxide such as an In—Ga—Zn-based oxide (also referred to as IGZO), an In—Al—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a binary metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; and the like.

Figure 8A:
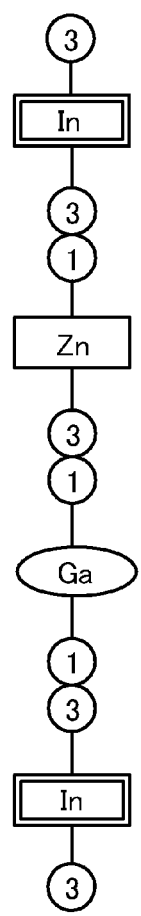
FIGS. 8A to 8C illustrate a structure of an oxide material which can be applied to one embodiment of the present invention.

As an example, FIG. 8A illustrates a model of a medium group included in a layer structure of an In—Ga—Zn-based oxide.

In the medium group included in the layer structure of the In—Ga—Zn-based oxide in FIG. 8A, in the order starting from the top, an In atom close to three tetracoordinate O atoms in each of an upper half and a lower half is bonded to a Zn atom close to one tetracoordinate O atom in an upper half, the Zn atom is bonded to a Ga atom close to one tetracoordinate O atom in each of an upper half and a lower half through three tetracoordinate O atoms in a lower half with respect to the Zn atom, and the Ga atom is bonded to an In atom close to three tetracoordinate O atoms in each of an upper half and a lower half through one tetracoordinate O atom in a lower half with respect to the Ga atom. A plurality of such medium groups is bonded to each other so that a large group is constituted.

Figure 8B:
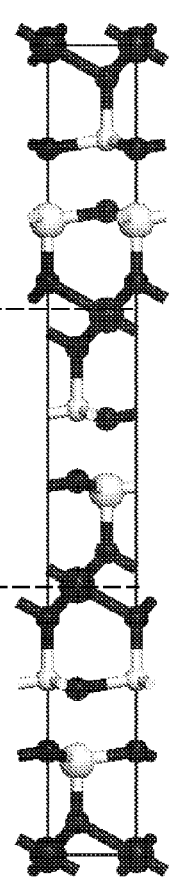
Figure 8C:
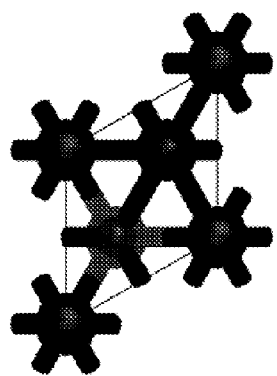

FIG. 8B illustrates a large group including three medium groups. Note that FIG. 8C illustrates atomic order in the case of the layer structure in FIG. 8B observed from the c-axis direction.

Here, since electric charge of a hexacoordinate or pentacoordinate In atom, electric charge of a tetracoordinate Zn atom, and electric charge of a pentacoordinate Ga atom are +3, +2, and +3, respectively, electric charge of a small group including any of an In atom, a Zn atom, and a Ga atom is 0. Thus, the total electric charge of a medium group having a combination of such small groups is always 0.

Further, a medium group forming the stacked structure of the In—Ga—Zn-based oxide is not limited to the medium group illustrated in FIG. 8A. A large group can be formed including a combination of a plurality of medium groups in which the arrangement of the In atom, the Ga atom, and the Zn atom is different from that in FIG. 8A.

When an In—Sn—Zn-based oxide is formed, an oxide target having a composition ratio: In:Sn:Zn=1:2:2, 2:1:3, 1:1:1, or 20:45:35 in an atomic ratio may be used.

The thickness of the oxide semiconductor film 110 is preferably greater than or equal to 3 nm and less than or equal to 50 nm.

Figure 2A:
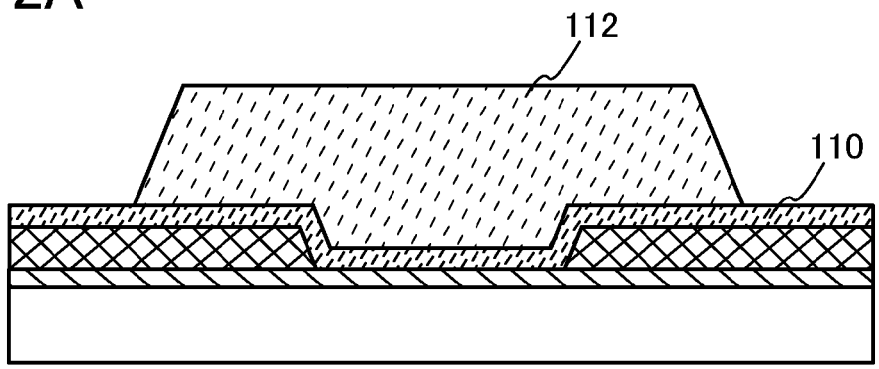
FIGS. 2A to 2C illustrate a method for manufacturing a semiconductor device according to one embodiment of the present invention.

Next, the second etching mask 112 is formed over the oxide semiconductor film 110 (FIG. 2A).

Here, when the base insulating film 102 is formed using an insulating oxide which functions as an oxygen supply source, heat treatment which supplies oxygen to the oxide semiconductor film 110 may be performed after the oxide semiconductor film 110 is formed and before the second etching mask 112 is formed.

The second etching mask 112 may be formed using a resist material. Note that there is no limitation thereto as long as it functions as a mask when the oxide semiconductor film 110 is processed.

Figure 2B:
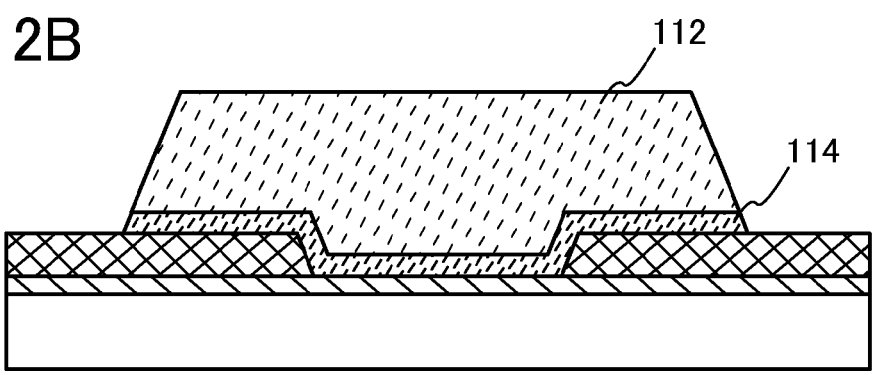

Next, the oxide semiconductor film 110 is processed with the use of the second etching mask 112, so that the oxide semiconductor film 114 is formed (FIG. 2B).

The oxide semiconductor film 110 may be processed by dry etching. For example, a chlorine gas or a mixed gas of a boron trichloride gas and a chlorine gas can be given as an etching gas used for the dry etching. However, there is no limitation thereto; wet etching may be used or another method may be used.

Figure 2C:
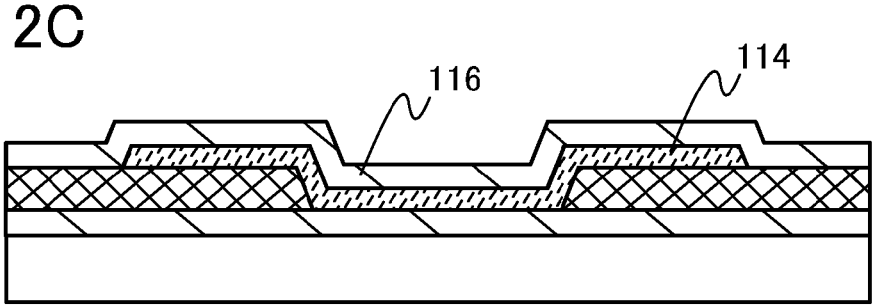

Next, the second etching mask 112 is removed, and the first insulating film 116 is formed so as to cover at least the oxide semiconductor film 114 (FIG. 2C).

In the case where the second etching mask 112 is formed using a resist material, the second etching mask 112 may be removed by ashing using oxygen plasma. Alternatively, a resist stripper may be used. Further, alternatively, both of them may be used.

The first insulating film 116 is formed using an insulating oxide which functions as an oxygen supply source, and may be formed using silicon oxide, silicon oxynitride, or silicon nitride oxide, for example.

The thickness of the first insulating film 116 may be greater than or equal to 1 nm and less than or equal to 30 nm, preferably greater than or equal to 3 nm and less than or equal to 10 nm.

The first insulating film 116 may be formed by a sputtering method.

Here, the first insulating film 116 is formed using an insulating oxide which functions as an oxygen supply source. Therefore, heat treatment which supplies oxygen to the oxide semiconductor film 114 is preferably performed after the first insulating film 116 is formed. By performing heat treatment which supplies oxygen to the oxide semiconductor film 114, the number of oxygen defects can be reduced.

The first insulating film 116 functions as at least a gate insulating film.

Figure 3A:
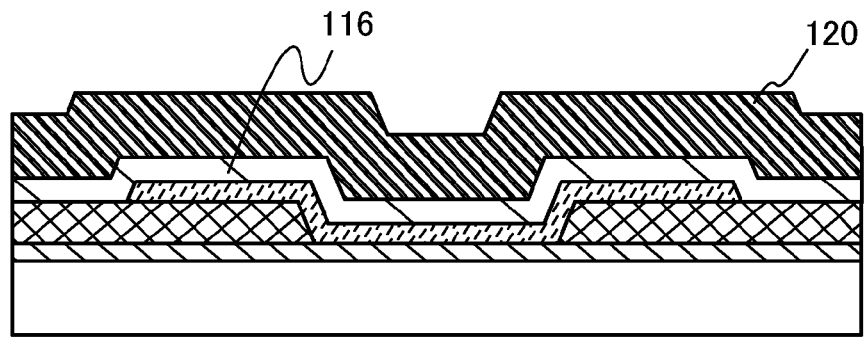
FIGS. 3A to 3C illustrate a method for manufacturing a semiconductor device according to one embodiment of the present invention.

Next, the second conductive film 120 is formed over the first insulating film 116 (FIG. 3A).

The second conductive film 120 may be formed using a material and a method similar to those of the first conductive film 104.

Figure 3B:
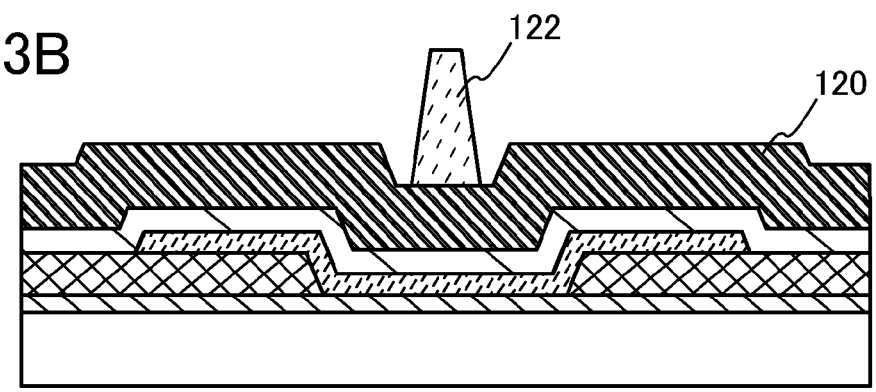

Next, the third etching mask 122 is formed over the second conductive film 120 (FIG. 3B).

The third etching mask 122 may be formed using a resist material. However, there is no limitation thereto as long as it functions as a mask when the second conductive film 120 is processed.

Figure 3C:
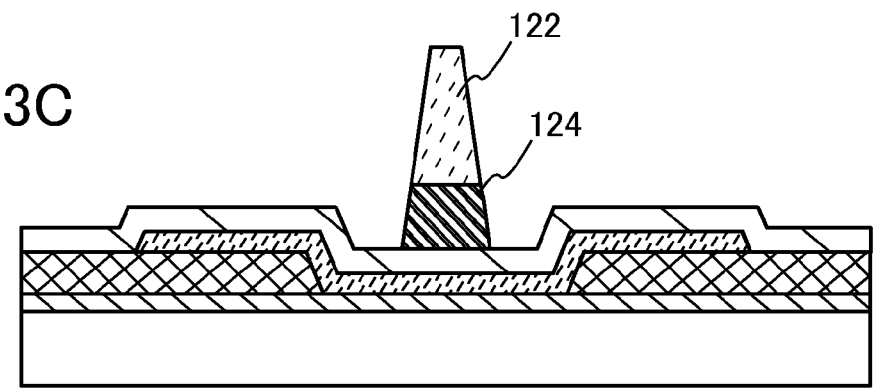

Next, the second conductive film 120 is processed with the use of the third etching mask 122, so that the second conductive film 124 is formed (FIG. 3C).

The second conductive film 120 may be processed by dry etching. For example, a chlorine gas or a mixed gas of a boron trichloride gas and a chlorine gas can be given as an etching gas used for the dry etching. However, there is no limitation thereto; wet etching may be used or another method may be used.

The second conductive film 124 functions as at least a gate electrode.

Figure 4A:
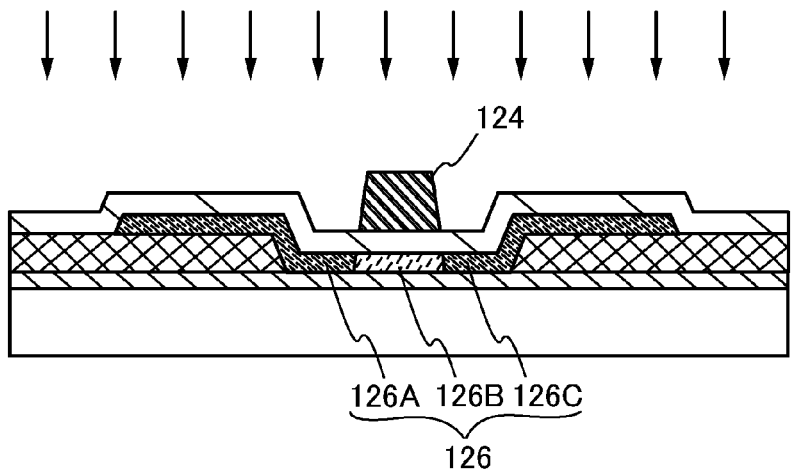
FIGS. 4A to 4C illustrate a method for manufacturing a semiconductor device according to one embodiment of the present invention.

Next, the third etching mask 122 is removed and a dopant is added to the oxide semiconductor film 114 using the second conductive film 124 as a mask, so that the oxide semiconductor film 126 including the source region and the drain region is formed (FIG. 4A). The oxide semiconductor film 126 includes a region 126A which is one of the source region and the drain region, a region 126B which functions as a channel formation region, and a region 126C which is the other of the source region and the drain region.

In the case where the third etching mask 122 is formed using a resist material, the third etching mask 122 may be removed by ashing using oxygen plasma. Alternatively, a resist stripper may be used. Further, alternatively, both of them may be used.

The dopant to the oxide semiconductor film 114 may be added by an ion implantation method or an ion doping method. Alternatively, the dopant may be added by performing plasma treatment in an atmosphere of a gas containing the dopant. As the added dopant, phosphorus, arsenic, or the like may be used.

Note that dopant may be added in the state where the third etching mask 122 is formed. Alternatively, dopant may be added after a second insulating film 118 which is described below is formed.

Figure 4B:
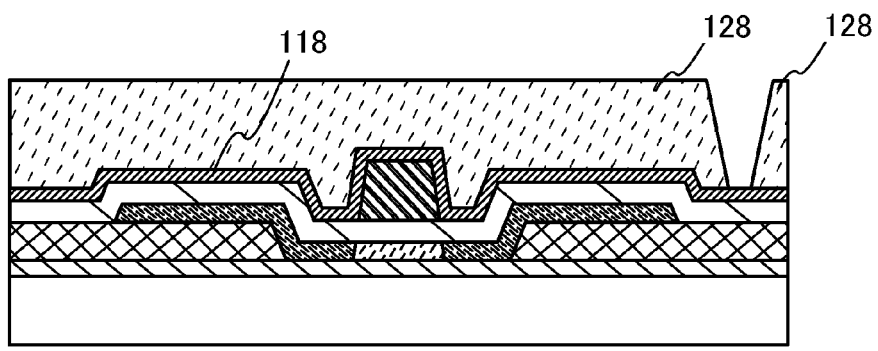

Next, the second insulating film 118 is formed over the first insulating film 116 and the second conductive film 124, and a fourth etching mask 128 is formed over a portion of the second insulating film 118 other than the portion of the second insulating film 118 over which the opening portion is formed (FIG. 4B).

The second insulating film 118 is formed using a material which has a high gas barrier property and is not easily etched. As such a material, an aluminum oxide can be used, for example.

The thickness of the second insulating film 118 may be greater than or equal to 30 nm, and may be preferably greater than or equal to 50 nm.

The second insulating film 118 may be formed by a CVD method or a sputtering method.

The fourth etching mask 128 may be formed using a resist material. Note that the material of the fourth etching mask 128 is not limited thereto as long as the material functions as a mask when the first insulating film 116 and the second insulating film 118 are processed.

Figure 4C:
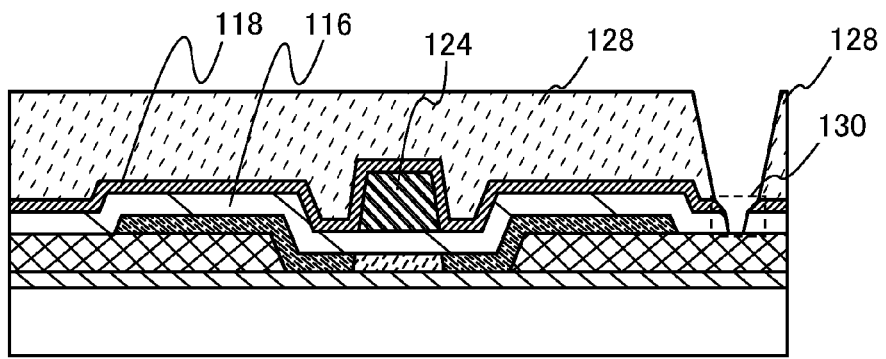

Next, a portion of the second insulating film 118 and a portion of the first insulating film 116, which are not covered with the fourth etching mask 128, are processed to form an opening portion 130 (FIG. 4C). Since the second insulating film 118 is formed using a material which is not easily etched, in the opening portion 130, an inclination angle between a side surface of the second insulating film 118 and the substrate surface is smaller than an inclination angle between a side surface of the first insulating film 116 and the substrate surface.

The second insulating film 118 and the first insulating film 116 may be processed by dry etching. For example, a chlorine gas or a mixed gas of a boron trichloride gas and a chlorine gas can be given as an etching gas used for the dry etching. However, there is no limitation thereto; wet etching may be used or another method may be used.

Argon plasma treatment may be performed in the state in FIG. 4C (First Mode). Instead of argon, another rare gas (such as helium, krypton, or xenon) may be used. By argon plasma treatment, unevenness of the surface of the opening portion 130 is removed, and planarity of the surface is improved.

Figure 5A:
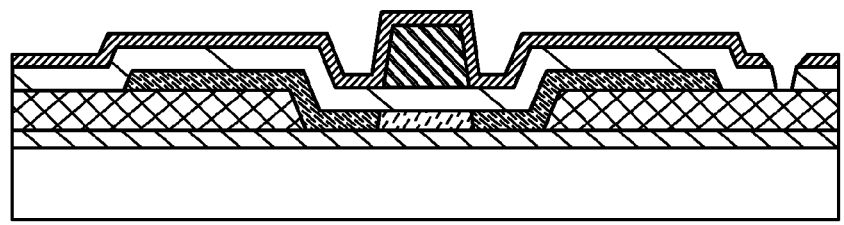
FIGS. 5A to 5C illustrate a method for manufacturing a semiconductor device according to one embodiment of the present invention.

Then, the fourth etching mask 128 is removed (FIG. 5A).

In the case where the fourth etching mask 128 is formed using a resist material, the fourth etching mask 128 may be removed by ashing using oxygen plasma. Alternatively, a resist stripper may be used. Further, alternatively, both of them may be used.

Figure 5B:
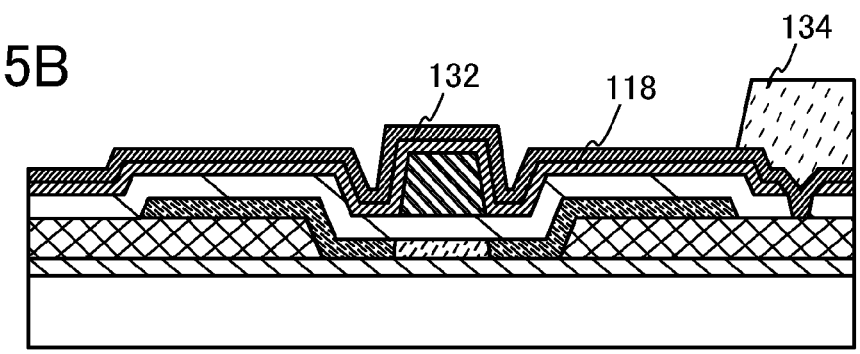

Next, a third conductive film 132 is formed over the second insulating film 118 so as to connect with the first conductive film 108 in the opening portion 130, and a fifth etching mask 134 is formed over the third conductive film 132 (FIG. 5B).

The third conductive film 132 may be formed using a material and a method similar to those of the first conductive film 104 and the second conductive film 120. However, in the case where the semiconductor device is a display device, the third conductive film 132 may be formed using a light-transmitting conductive material such as indium tin oxide, indium oxide containing tungsten oxide, indium zinc oxide containing tungsten oxide, indium oxide containing titanium oxide, indium tin oxide containing titanium oxide, or indium tin oxide to which indium zinc oxide or silicon oxide is added.

In the case where unevenness of the surface of the opening portion 130 is removed by argon plasma treatment, defective formation of the third conductive film 132 can be prevented.

The fifth etching mask 134 may be formed of a resist material. However, there is no limitation thereto as long as it functions as a mask when the third conductive film 132 is processed.

In the case where the third conductive film 132 is formed by a sputtering method, reverse sputtering is preferably performed on the opening portion 130 (Second Mode). This is because the reverse sputtering can be performed in a sputtering apparatus, and etching residues and the like in the opening portion 130 can be removed without lowering throughput. The reverse sputtering is preferably performed in the state illustrated in FIG. 5A. This is because, when the reverse sputtering is performed before the fourth etching mask 128 is removed, the substrate 100 has to be carried into the sputtering apparatus again after the reverse sputtering is performed, and throughput is lowered.

When unevenness of the surface of the opening portion 130 is removed by the reverse sputtering, defective formation of the third conductive film 132 can be prevented.

Figure 5C:
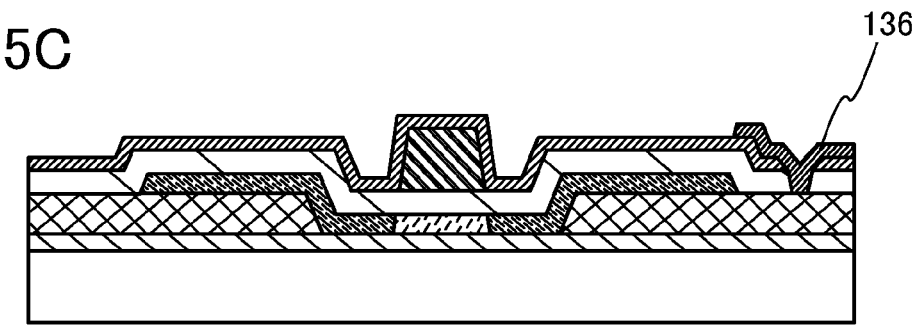

Next, the third conductive film 132 is processed using the fifth etching mask 134 to form a third conductive film 136. Then, the fifth etching mask 134 is removed (FIG. 5C).

The third conductive film 132 may be processed by dry etching or wet etching.

In the case where the fifth etching mask 134 is formed using a resist material, the fifth etching mask 134 may be removed by ashing using oxygen plasma. Alternatively, a resist stripper may be used. Further, alternatively, both of them may be used.

In the manner described above, the semiconductor device of this embodiment can be manufactured.

Note that the material of the first insulating film 116 and the second insulating film 118 may be reversed. At this time, since the first insulating film 116 is formed using a material which is not easily etched, in the opening portion 130, the inclination angle between the side surface of the second insulating film 118 and the substrate surface is larger than that between the side surface of the first insulating film 116 and the substrate surface.

Embodiment 2

Although the case where an opening portion is formed in a stacked-layer insulating film having a two-layer structure is described in Embodiment 1, a stacked-layer insulating film in which an opening portion is formed may have a three-layer structure. In this embodiment, the case where a stacked-layer insulating film in which an opening portion is formed has a three-layer structure will be described. That is, a passivation film is formed before the opening portion is formed, and another opening portion may also be formed in the passivation film.

Figure 9A:
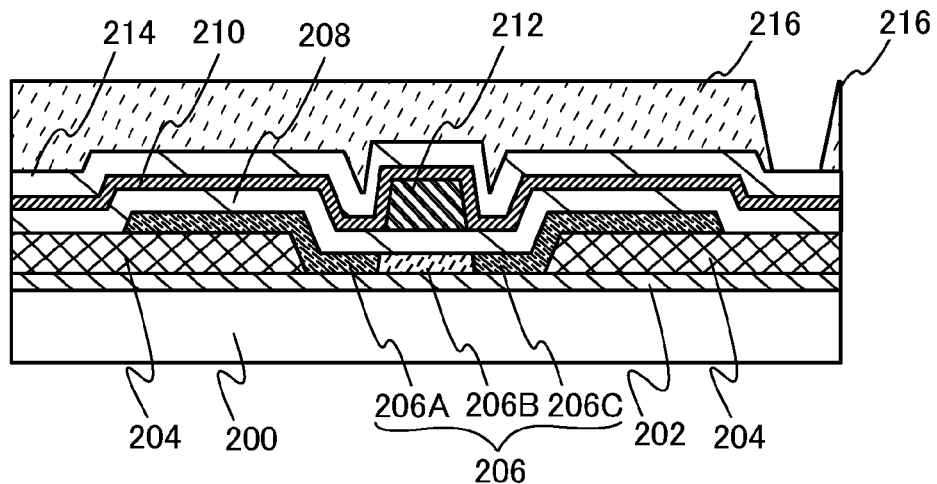
FIGS. 9A to 9C illustrate a method for manufacturing a semiconductor device according to one embodiment of the present invention.

First, in a manner similar to that in Embodiment 1, a base insulating film 202 is formed over a substrate 200, a first conductive film 204 is formed over the base insulating film 202, an oxide semiconductor film 206 is formed in contact with the first conductive film 204, a first insulating film 208 is formed to cover the oxide semiconductor film 206, a second conductive film 212 is formed over the first insulating film 208, and a second insulating film 210 and a third insulating film 214 are formed over the first insulating film 208 so as to cover the second conductive film 212. Then, a first etching mask 216 is formed over a portion of the third insulating film 214 other than the portion over which the opening portion is formed (FIG. 9A).

The oxide semiconductor film 206 includes a region 206A which is one of a source region and a drain region, a region 206B which is a channel formation region, and a region 206C which is the other of the source region and the drain region.

The substrate 200 corresponds to the substrate 100 in Embodiment 1. The base insulating film 202 corresponds to the base insulating film 102 in Embodiment 1.

The first conductive film 204 corresponds to the first conductive film 108 in Embodiment 1.

The oxide semiconductor film 206 corresponds to the oxide semiconductor film 126 in Embodiment 1.

The first insulating film 208 corresponds to the first insulating film 116 in Embodiment 1. Thus, the first insulating film 208 is formed by a sputtering method using an insulating oxide which functions as an oxygen supply source (e.g., silicon oxide, silicon oxynitride, or silicon nitride oxide).

Here, the first insulating film 208 is formed using an insulating oxide which functions as an oxygen supply source. Therefore, after the first insulating film 208 is formed, heat treatment which supplies oxygen to the oxide semiconductor film 206 is preferably performed.

The second insulating film 210 corresponds to the second insulating film 118 in Embodiment 1. That is, the second insulating film 210 is formed using a material which has a high gas barrier property and is less easily etched than the first insulating film 208 and the third insulating film 214.

The second conductive film 212 corresponds to the second conductive film 124 in Embodiment 1.

The third insulating film 214 is formed using a material and a method similar to those of the first insulating film 208. The third insulating film 214 functions as a passivation film. There is no particular limitation on the thickness of the third insulating film 214, but the thickness of the third insulating film 214 is preferably greater than or equal to 100 nm.

The first etching mask 216 corresponds to the fourth etching mask 128 in Embodiment 1.

Figure 9B:
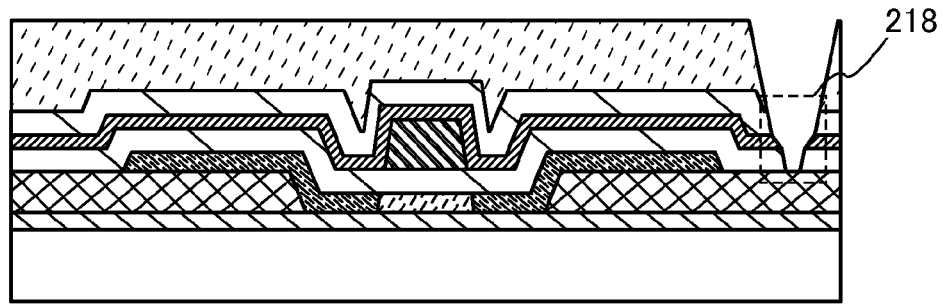

Next, the portions of the third insulating film 214, the second insulating film 210, and the first insulating film 208, which are not covered with the first etching mask 216 are processed so that an opening portion 218 is formed (FIG. 9B). Since the second insulating film 210 is formed using a material which is not easily etched, in the opening portion 218, the inclination angles between a side surface of the first insulating film 208 and the substrate surface and between a side surface of the third insulating film 214 and the substrate surface are larger than an inclination angle between a side surface of the second insulating film 210 and the substrate surface.

The opening portion 218 may be formed by dry etching. For example, a chlorine gas or a mixed gas of a boron trichloride gas and a chlorine gas can be given as an etching gas used for the dry etching. However, there is no limitation thereto; wet etching may be used or another method may be used.

Argon plasma treatment may be performed in the state illustrated in FIG. 9B (First Mode). Instead of argon, another rare gas (such as helium, krypton, or xenon) may be used. By argon plasma treatment, unevenness of the surface of the opening portion 218 is removed, and planarity of the surface is improved.

Figure 9C:
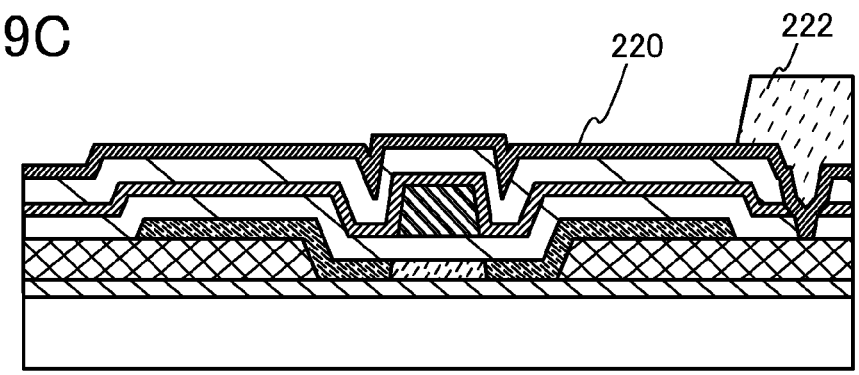

Next, the first etching mask 216 is removed, a third conductive film 220 is formed over the third insulating film 214 so as to connect with the first conductive film 204 in the opening portion 218, and a second etching mask 222 is formed over the third conductive film 220 (FIG. 9C).

In the case where the third conductive film 220 is formed by a sputtering method, reverse sputtering is preferably performed on the opening portion 218 (Second Mode). This is because the reverse sputtering can be performed in a sputtering apparatus, and etching residues and the like in the opening portion 218 can be removed without lowering throughput. The reverse sputtering is preferably performed after the first etching mask 216 is removed, before the third conductive film 220 is formed. This is because, when the reverse sputtering is performed before the first etching mask 216 is removed, the substrate 200 has to be carried into the sputtering apparatus again after the reverse sputtering is performed, and throughput is lowered.

After that, the third conductive film 220 is processed using the second etching mask 222, and the second etching mask 222 is removed (not illustrated).

In the manner described above, the semiconductor device of this embodiment can be manufactured.

In the case where an opening portion is formed in a stacked-layer insulating film having a three-layer structure as described in this embodiment, the shape of the opening portion varies depending on the thickness of the first to the third insulating films.

Figure 10A:
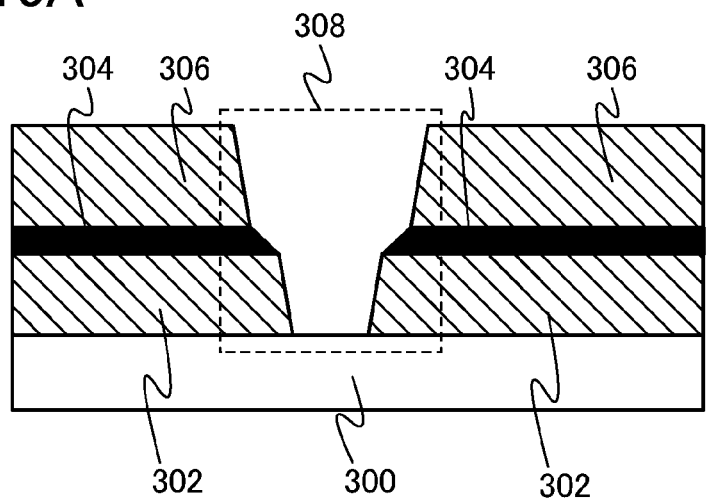
FIGS. 10A to 10C each illustrate a method for manufacturing a semiconductor device according to one embodiment of the present invention.

FIG. 10A shows a shape of an opening portion in the case where the thickness of the first insulating film is similar to that of the third insulating film. An opening portion 308 is formed in a first insulating film 302, a second insulating film 304, and a third insulating film 306 provided over a formation surface 300, and in the opening portion 308, an inclination angle between a side surface of the second insulating film 304 and the formation surface 300 is smaller than inclination angles between a side surface of the first insulating film 302 and the formation surface 300 and between a side surface of the third insulating film 306 and the formation surface 300.

Figure 10B:
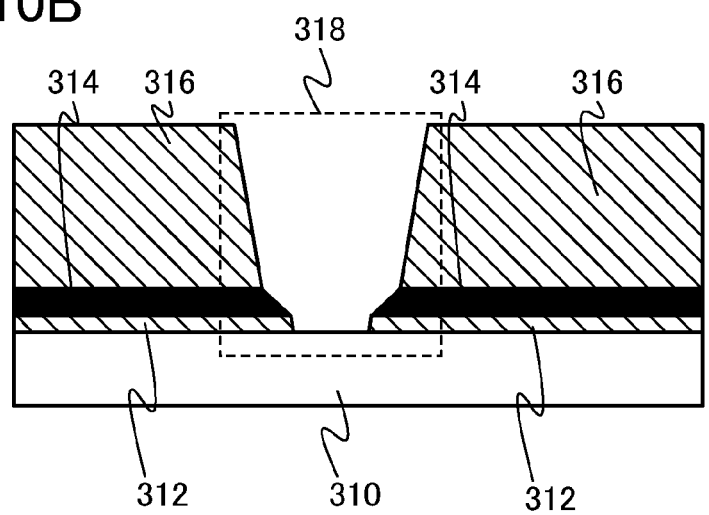

FIG. 10B shows a shape of an opening portion in the case where the first insulating film is thinner than the third insulating film. An opening portion 318 is formed in a first insulating film 312, a second insulating film 314, and a third insulating film 316 provided over a formation surface 310, and in the opening portion 318, an inclination angle between a side surface of the second insulating film 314 and the formation surface 310 is smaller than inclination angles between a side surface of the first insulating film 312 and the formation surface 310 and between a side surface of the third insulating film 316 and the formation surface 310.

Figure 10C:
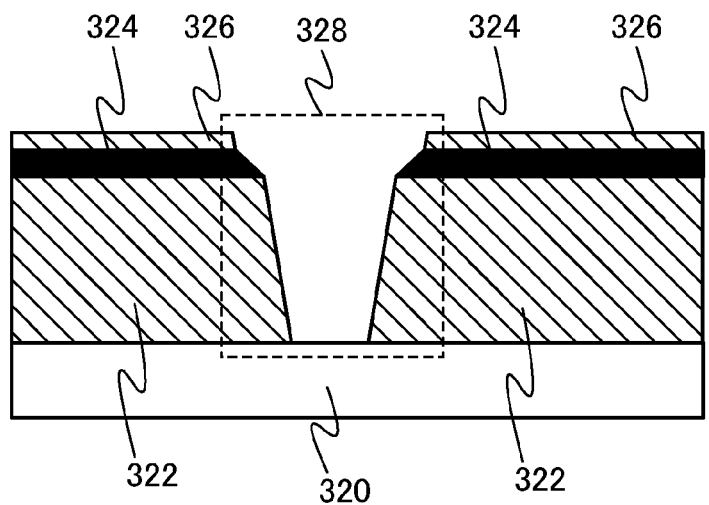

FIG. 10C shows a shape of an opening portion in the case where the first insulating film is thicker than the third insulating film. An opening portion 328 is formed in a first insulating film 322, a second insulating film 324, and a third insulating film 326 provided over a formation surface 320, and in the opening portion 328, an inclination angle between a side surface of the second insulating film 324 and the formation surface 320 is smaller than inclination angles between the side surface of the first insulating film 322 and the formation surface 320 and between a side surface of the third insulating film 326 and the formation surface 320.

In FIGS. 10A to 10C, the second insulating film is formed using a material which is not easily etched; therefore, it takes longer time to etch the second insulating film than to etch the first insulating film or the third insulating film. Therefore, when the second insulating film is etched, the larger the exposed portion of the opening portion is, the more remarkable a phenomenon in which a particle and the like generated by etching are attached to the opening portion (redeposition) is. In FIG. 10B, when the second insulating film which is not easily etched is etched, the redeposition is caused in a wide range of the opening portion.

Therefore, in the case where the first insulating film is thinner than the third insulating film as illustrated in FIG. 10B, the effect of argon plasma treatment or reverse sputtering is particularly remarkable. For this reason, in the semiconductor device in the present invention, it is preferable that the first insulating film is thinner than the third insulating film.

However, the present invention is not limited thereto; the thickness of the first insulating film may be similar to that of the third insulating film as illustrated in FIG. 10A, or the first insulating film may be thicker than the third insulating film as illustrated in FIG. 10C.

In this embodiment, a top-gate bottom-contact transistor is illustrated and described; however, the present invention is not limited thereto. The transistor may be a top-gate top-contact transistor, a bottom-gate bottom-contact transistor, or a bottom-gate top-contact transistor.

Example 1

In this example, a comparative example in which a three-layer insulating film is formed and an opening portion is formed in the three-layer insulating film and an example which is one embodiment of the present invention and in which the opening portion is subjected to argon plasma treatment in the state where the opening portion is exposed are compared and described.

First, a base insulating film 202 was formed using silicon oxynitride over a substrate 200 by a plasma CVD method. Its thickness was 100 nm.

Next, a first conductive film 204 was formed using tungsten over the base insulating film 202 by a sputtering method. Its thickness was 150 nm.

Next, a first insulating film 208 was formed using silicon oxynitride over the first conductive film 204 by a plasma CVD method. Its thickness was 30 nm.

Next, a second insulating film 210 was formed using aluminum oxide by a sputtering method. Its thickness was 100 nm.

Next, a third insulating film 214 was formed using silicon oxynitride by a plasma CVD method. Its thickness was 300 nm.

Then, a first etching mask 216 was formed over the third insulating film 214. In the state where the first etching mask 216 was formed, the third insulating film 214, the second insulating film 210, and the first insulating film 208 were etched and an opening portion 218 was formed. The etching was performed in the following conditions.

Flow rate of trifluoromethane ($CHF_3$) gas: 22.5 sccm
Flow rate of helium (He) gas: 127.5 sccm
Flow rate of methane ($CH_4$) gas: 5 sccm
Pressure in reaction chamber: 5.0 Pa
ICP power: 475 W
Bias power between upper electrode and lower electrode: 300 W
Substrate temperature: 70° C.

Next, only Example Sample was subjected to argon plasma treatment in the state where the opening portion 218 was exposed. The plasma treatment was performed in the following conditions.

Flow rate of argon (Ar) gas: 100 sccm
Pressure in reaction chamber: 1.35 Pa
ICP power: 500 W
Bias power between upper electrode and lower electrode: 100 W
Substrate temperature: −10° C.

After that, the first etching mask 216 was removed, and a stacked-layer conductive film was formed in the opening portion 218 by a sputtering method. The stacked-layer conductive film has a stacked-layer structure including a titanium layer, a tungsten layer, an aluminum layer, and a titanium layer having thicknesses of 20 nm, 50 nm, 200 nm, and 50 nm, respectively.

Figure 11A:
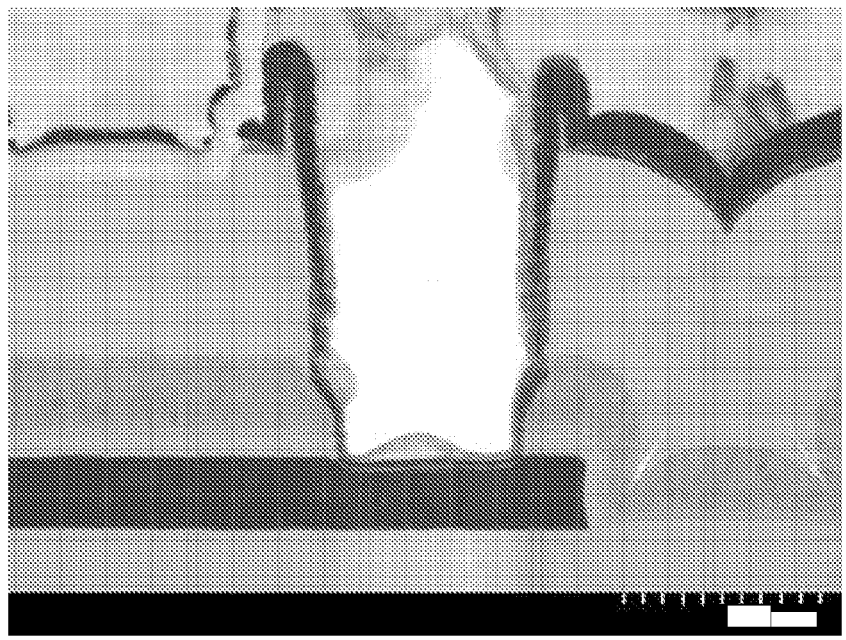
FIGS. 11A and 11B are cross-sectional STEM images showing openings of Comparative Sample and Example Sample.
Figure 11B:
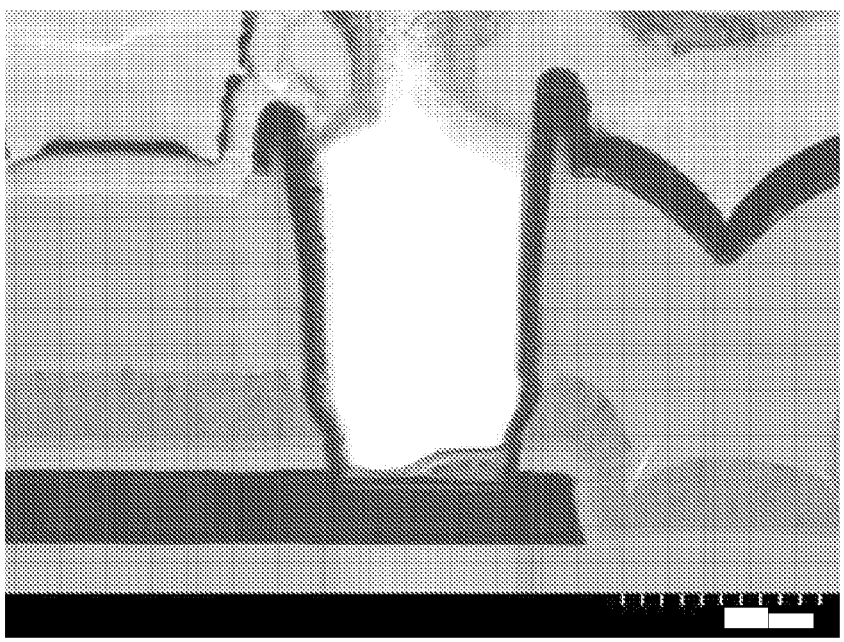
Figure 11A:
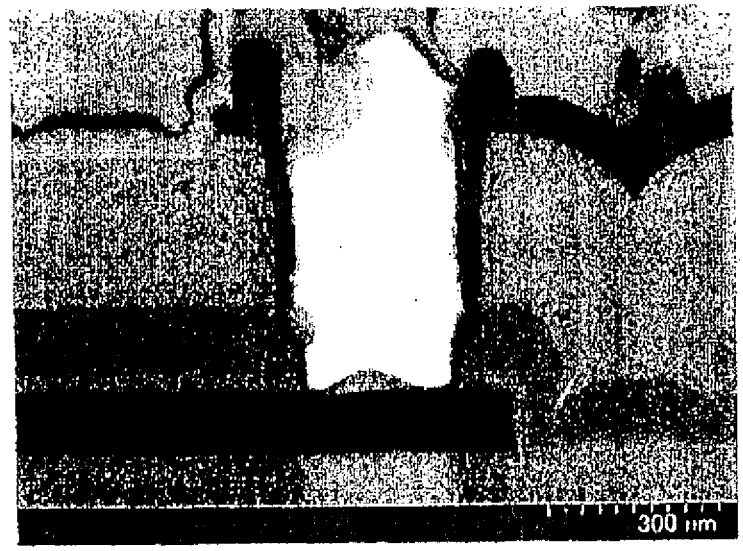
Figure 11B:
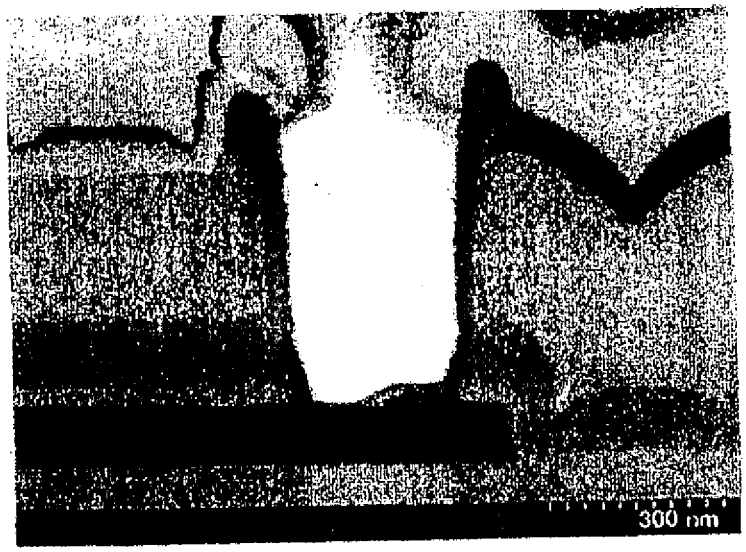

FIGS. 11A and 11B show cross-sectional STEM (scanning transmission electron microscope) images of Example Sample and Comparative Sample in which a stacked-layer conductive film was formed in the opening portion 218. FIG. 11A shows Comparative Sample and FIG. 11B shows Example Sample.

From the comparison between FIG. 11A and FIG. 11B, it is found that in the sample shown in FIG. 11B which is subjected to argon plasma treatment, unevenness of the surface of the opening portion 218 was removed, and planarity of the surface is high. Therefore, a stacked-layer conductive film is favorably formed with high uniformity.

Further, when contact resistance in Example Sample and Comparative Sample is measured, at contact diameters of 0.4 μm and 0.5 μm, variation is extremely large in Comparative Sample, while variation is small in Example Sample. Further-more, in Example Sample, the contact resistance tends to converge at the neighborhood of the lowest resistance in Comparative Sample.

This application is based on Japanese Patent Application serial no. 2011-135024 filed with Japan Patent Office on Jun. 17, 2011, the entire contents of which are hereby incorporated by reference.

What is claimed is:

1. A semiconductor device comprising:
an oxide semiconductor film that comprises a source region, a drain region and a channel formation region between the source region and the drain region, wherein each of the source region and the drain region comprises an impurity;
an electrode electrically connected to the oxide semiconductor films, wherein the electrode is one of a source electrode and a drain electrode;
a gate electrode over the oxide semiconductor film, the gate electrode overlapping with the channel formation region;
a first insulating film over the oxide semiconductor film and the electrode, wherein the first insulating film is capable of supplying oxygen into the oxide semiconductor film, and is located between the oxide semiconductor film and the gate electrode;
a second insulating film over the first insulating film; and
a conductive film over the second insulating film, wherein the conductive film is electrically connected to the electrode through an opening of the first insulating film and an opening of the second insulating film,
wherein a first angle between a side surface of the first insulating film and a bottom surface of the first insulating film at the opening of the first insulating film is larger than a second angle between a side surface of the second insulating film and a bottom surface of the second insulating film at the opening of the second insulating film,
wherein the side surface of the first insulating film and the side surface of the second insulating film are in contact with the conductive film at the respective openings, and
wherein the oxide semiconductor film comprises non-single crystals of an In—Ga—Zn-based oxide in which a c-axis is aligned in a direction substantially perpendicular to a surface of the oxide semiconductor film, wherein an a-axis of one of the non-single crystals is different from an a-axis of another of the non-single crystals, or a b-axis of one of the non-single crystals is different from a b-axis of another of the non-single crystals.

2. The semiconductor device according to claim 1, further comprising:
a third insulating film over the second insulating film,
wherein a third angle between a side surface of the third insulating film and a bottom surface of the third insulating film is larger than the second angle.

3. The semiconductor device according to claim 1,
wherein the first insulating film comprises one of a silicon oxide, a silicon oxynitride, and a silicon nitride oxide, and
wherein the second insulating film comprises aluminum oxide.

4. The semiconductor device according to claim 1, wherein a thickness of the first insulating film is thinner than the gate electrode.

5. A semiconductor device comprising:
an oxide semiconductor film that comprises a source region, a drain region and a channel formation region between the source region and the drain region, wherein each of the source region and the drain region comprises an impurity;
a source electrode and a drain electrode which are electrically connected to the oxide semiconductor film;
a gate electrode over the oxide semiconductor film, the gate electrode overlapping with the channel formation region;
a first insulating film over the oxide semiconductor film, the source electrode, and the drain electrode, wherein the first insulating film is capable of supplying oxygen into the oxide semiconductor film, and is located between the oxide semiconductor film and the gate electrode;
a second insulating film over the first insulating film and the gate electrode; and
a conductive film over the second insulating film, wherein the conductive film is electrically connected to one of the source electrode and the drain electrode through an opening of the first insulating film and an opening of the second insulating film,
wherein a first angle between a side surface of the first insulating film and a bottom surface of the first insulating film at the opening of the first insulating film is larger than a second angle between a side surface of the second insulating film and a bottom surface of the second insulating film at the opening of the second insulating film,
wherein the side surface of the first insulating film and the side surface of the second insulating film are in contact with the conductive film at the respective openings, and
wherein the oxide semiconductor film comprises non-single crystals of an In—Ga—Zn-based oxide in which a c-axis is aligned in a direction substantially perpendicular to a surface of the oxide semiconductor film, wherein an a-axis of one of the non-single crystals is different from an a-axis of another of the non-single crystals, or a b-axis of one of the non-single crystals is different from a b-axis of another of the non-single crystals.

6. The semiconductor device according to claim 5, further comprising:
a third insulating film over the second insulating film,
wherein a third angle between a side surface of the third insulating film and a bottom surface of the third insulating film is larger than the second angle.

7. The semiconductor device according to claim 5,
wherein the first insulating film comprises one of a silicon oxide, a silicon oxynitride, and a silicon nitride oxide, and
wherein the second insulating film comprises aluminum oxide.

8. The semiconductor device according to claim 5, wherein a thickness of the first insulating film is thinner than the gate electrode.

9. The semiconductor device according to claim 5, wherein a concentration of the impurity in each of the source region and the drain region is larger than a concentration of the impurity in the channel formation region.

10. A semiconductor device comprising:
an oxide semiconductor film that comprises a source region, a drain region and a channel formation region between the source region and the drain region, wherein each of the source region and the drain region comprises an impurity;
an electrode electrically connected to the oxide semiconductor film, wherein the electrode is one of a source electrode and a drain electrode;

a gate electrode over the oxide semiconductor film, the gate electrode overlapping with the channel formation region;

a first insulating film over the oxide semiconductor film and the electrode, wherein the first insulating film is capable of supplying oxygen into the oxide semiconductor film, and is located between the oxide semiconductor film and the gate electrode;

a second insulating film over the first insulating film; and a conductive film over the second insulating film, wherein the conductive film is electrically connected to the electrode through an opening of the first insulating film and an opening of the second insulating film, wherein a first angle between a side surface of the first insulating film and a bottom surface of the first insulating film at the opening of the first insulating film is larger than a second angle between a side surface of the second insulating film and a bottom surface of the second insulating film at the opening of the second insulating film, wherein the side surface of the first insulating film and the side surface of the second insulating film are in contact with the conductive film at the respective openings, wherein the oxide semiconductor film comprises non-single crystals of an In—Ga—Zn-based oxide in which a c-axis is aligned in a direction substantially perpendicular to a surface of the oxide semiconductor film, wherein an a-axis of one of the non-single crystals is different from an a-axis of another of the non-single crystals, or a b-axis of one of the non-single crystals is different from a b-axis of another of the non-single crystals, and wherein the impurity is one of phosphorus and arsenic.

11. The semiconductor device according to claim 10, further comprising:

a third insulating film over the second insulating film, wherein a third angle between a side surface of the third insulating film and a bottom surface of the third insulating film is larger than the second angle.

12. The semiconductor device according to claim 10, wherein the first insulating film comprises one of a silicon oxide, a silicon oxynitride, and a silicon nitride oxide, and wherein the second insulating film comprises aluminum oxide.

13. The semiconductor device according to claim 10, wherein a thickness of the first insulating film is thinner than the gate electrode.

* * * * *

UNITED STATES PATENT AND TRADEMARK OFFICE
CERTIFICATE OF CORRECTION

PATENT NO. : 8,901,554 B2
APPLICATION NO. : 13/484742
DATED : December 2, 2014
INVENTOR(S) : Shinya Sasagawa et al.

It is certified that error appears in the above-identified patent and that said Letters Patent is hereby corrected as shown below:

In the Drawings

Delete Drawing Sheet 11, and replace with Drawing Sheet 11. (Attached)

In the Claims

In claim 1, at column 19, line 17, "films," should be --film,--.

Signed and Sealed this
Fourteenth Day of April, 2015

Michelle K. Lee
*Director of the United States Patent and Trademark Office*

UNITED STATES PATENT AND TRADEMARK OFFICE
CERTIFICATE OF CORRECTION

PATENT NO. : 8,901,554 B2  
APPLICATION NO. : 13/484742  
DATED : December 2, 2014  
INVENTOR(S) : Shinya Sasagawa et al.

Page 1 of 1

It is certified that error appears in the above-identified patent and that said Letters Patent is hereby corrected as shown below:

In the Claims

In claim 1, at column 19, line 17, "films," should be --film,--.

Signed and Sealed this  
Fifteenth Day of September, 2015

Michelle K. Lee  
*Director of the United States Patent and Trademark Office*